United States Patent
Choi et al.

(10) Patent No.: US 12,159,832 B2
(45) Date of Patent: Dec. 3, 2024

(54) INTEGRATED CIRCUIT DEVICE

(71) Applicant: Samsung Electronics Co., Ltd., Suwon-si (KR)

(72) Inventors: Dawoon Choi, Hwaseong-si (KR); Myungsoo Noh, Hwaseong-si (KR); Noyoung Chung, Hwaseong-si (KR); Sunghun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 428 days.

(21) Appl. No.: 17/648,598

(22) Filed: Jan. 21, 2022

(65) Prior Publication Data

US 2022/0415782 A1 Dec. 29, 2022

(30) Foreign Application Priority Data

Jun. 23, 2021 (KR) .................. 10-2021-0081799

(51) Int. Cl.
*H01L 29/786* (2006.01)
*B82Y 10/00* (2011.01)
(Continued)

(52) U.S. Cl.
CPC .... *H01L 23/528* (2013.01); *H01L 21/823475* (2013.01); *H01L 27/0886* (2013.01);
(Continued)

(58) Field of Classification Search
CPC ........... H01L 23/528; H01L 21/823475; H01L 27/0886; H01L 29/0665; H01L 29/41733; H01L 29/41791; H01L 29/42392; H01L 29/7851; H01L 29/78696; H01L 21/823821; H01L 21/76805; H01L 29/0692; H01L 29/0847; H01L 29/1079; H01L 23/485; H01L 23/5226;
(Continued)

(56) References Cited

U.S. PATENT DOCUMENTS

| | | | |
|---|---|---|---|
| 8,431,985 B2 | 4/2013 | Hou et al. | |
| 9,780,178 B2 | 10/2017 | Xie et al. | |

(Continued)

FOREIGN PATENT DOCUMENTS

| | | |
|---|---|---|
| KR | 101187309 B1 | 10/2012 |
| KR | 1020190140790 A | 12/2019 |
| KR | 1020210054753 A | 5/2021 |

*Primary Examiner* — Herve-Louis Y Assouman
(74) *Attorney, Agent, or Firm* — Myers Bigel, P.A.

(57) ABSTRACT

An integrated circuit (IC) device includes a fin-type active region extending in a first lateral direction on a device region of a substrate. A gate line extends in a second lateral direction on the fin-type active region. The second lateral direction intersects with the first lateral direction. A source/drain region is adjacent to one side of the gate line on the fin-type active region. A gate contact is on the gate line and connected to the gate line. A source/drain contact is on the source/drain region and includes a first segment facing the gate contact and a second segment integrally connected to the first segment. The second segment extends from the first segment in the second lateral direction. In the first lateral direction, a first distance from the first segment to the gate line is greater than a second distance from the second segment to the gate line.

17 Claims, 50 Drawing Sheets

(51) Int. Cl.
    *H01L 21/768*      (2006.01)
    *H01L 21/8234*     (2006.01)
    *H01L 21/8238*     (2006.01)
    *H01L 23/485*      (2006.01)
    *H01L 23/522*      (2006.01)
    *H01L 23/528*      (2006.01)
    *H01L 27/02*       (2006.01)
    *H01L 27/088*      (2006.01)
    *H01L 27/092*      (2006.01)
    *H01L 29/06*       (2006.01)
    *H01L 29/08*       (2006.01)
    *H01L 29/10*       (2006.01)
    *H01L 29/417*      (2006.01)
    *H01L 29/423*      (2006.01)
    *H01L 29/66*       (2006.01)
    *H01L 29/775*      (2006.01)
    *H01L 29/78*       (2006.01)

(52) U.S. Cl.
    CPC .... *H01L 29/0665* (2013.01); *H01L 29/41733* (2013.01); *H01L 29/41791* (2013.01); *H01L 29/42392* (2013.01); *H01L 29/7851* (2013.01); *H01L 29/78696* (2013.01)

(58) Field of Classification Search
    CPC ............... H01L 23/5283; H01L 27/092; H01L 27/0924; H01L 29/0673; H01L 29/66439; H01L 29/775; H01L 21/823871; H01L 21/823412; H01L 21/823418; H01L 21/823431; H01L 21/823437; H01L 27/0207; B82Y 10/00
    See application file for complete search history.

(56)        References Cited

U.S. PATENT DOCUMENTS 10,014,215 B2     7/2018   Labonte et al.
    10,366,989 B2     7/2019   Chang et al.
    10,693,005 B2     6/2020   Alptekin et al.
    10,748,911 B2     8/2020   Singh et al.
    10,832,943 B2    11/2020   Fan et al.
    2020/0075595 A1*  3/2020   Shin ................ H01L 21/823871
    2021/0134796 A1   5/2021   Kim et al.

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2021-0081799, filed on Jun. 23, 2021, in the Korean Intellectual Property Office, the disclosure of which is incorporated by reference herein in its entirety.

BACKGROUND

The inventive concept relates to an integrated circuit (IC) device, and more particularly, to an IC device including a fin field-effect transistor (FinFET).

Recently, as the downscaling of IC devices has progressed rapidly, IC devices may need to provide not only a fast operation speed but also operational accuracy. Accordingly, it may be desirable to develop technology for IC devices to ensure that wirings and contacts are separated by sufficient insulation distances within relatively small areas while maintaining or improving reliability.

SUMMARY

The inventive concept provides an integrated circuit (IC) device, which includes a device region of which an area is reduced with the downscaling of IC devices, and has a structure capable of improving reliability.

According to an aspect of the inventive concept, there is provided an IC device includes a fin-type active region extending in a first lateral direction on a device region of a substrate. A gate line extends in a second lateral direction on the fin-type active region. The second lateral direction intersects with the first lateral direction. A source/drain region is adjacent to one side of the gate line on the fin-type active region. A gate contact is on the gate line and connected to the gate line. A source/drain contact is on the source/drain region. The source/drain contact includes a first segment facing the gate contact and a second segment integrally connected to the first segment. The second segment extends from the first segment in the second lateral direction. A first distance from the first segment to the gate line is greater than a second distance from the second segment to the gate line in the first lateral direction.

According to another aspect of the inventive concept, there is provided an IC device including a substrate including a device region and an inter-device isolation region defining the device region. A fin-type active region extends in a first lateral direction on the device region. A gate line is on the fin-type active region. The gate line extends lengthwise in a second lateral direction on the substrate over the device region and the inter-device isolation region. A first source/drain region and a second source/drain region are on the fin-type active region. The first source/drain region and the second source/drain region are apart from each other with the gate line therebetween in the first lateral direction. A gate contact is on the gate line. The gate contact is connected to the gate line. A first source/drain contact is on the first source/drain region. A second source/drain contact is on the second source/drain region. The first source/drain contact, the second source/drain contact, or both of the first source/drain contact and the second source/drain contact includes a first segment facing the gate contact and a second segment integrally connected to the first segment. The second segment extends from the first segment in the second lateral direction. A first distance from the first segment to the gate line is greater than a second distance from the second segment to the gate line in the first lateral direction.

According to another aspect of the inventive concept, there is provided an IC device including a substrate including a device region and an inter-device isolation region defining the device region. A fin-type active region extends on the device region in a first lateral direction. A plurality of gate lines are on the fin-type active region. The plurality of gate lines extend lengthwise in the second lateral direction on the substrate over the device region and the inter-device isolation region. A plurality of source/drain regions are on the fin-type active region. The plurality of source/drain regions are arranged one by one between the plurality of gate lines. A plurality of gate contacts are on and connected to the plurality of gate lines, respectively. A plurality of source/drain contacts are on the plurality of source/drain regions. At least one of the plurality of source/drain contacts includes a first segment and a second segment integrally connected to the first segment. The first segment faces one gate contact selected from the plurality of gate contacts. The second segment extends from the first segment in the second lateral direction. A first distance from the first segment to a first gate line to which the selected gate contact is connected, from among the plurality of gate lines, is greater than a second distance from the second segment to the first gate line in the first lateral direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
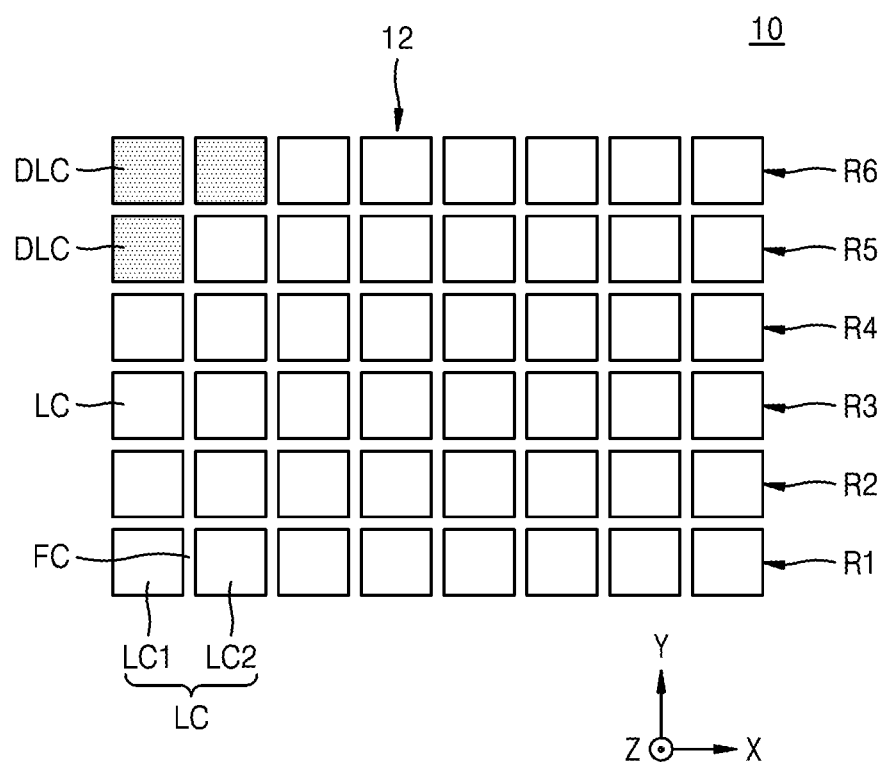
FIG. 1 is a plan layout diagram of a cell block of an integrated circuit (IC) device, according to example embodiments of the inventive concept.

Hereinafter, embodiments will be described in detail with reference to the accompanying drawings. The same reference numerals are used to denote the same elements in the drawings, and repeated descriptions thereof will be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a plan layout diagram of a cell block 12 of an integrated circuit (IC) device 10, according to example embodiments of the inventive concept.

Referring to FIG. 1, the cell block 12 of the IC device 10 may include a plurality of logic cells LC and a plurality of dummy logic cells DLC, which include circuit patterns configured to constitute various circuits. The plurality of logic cells LC and the plurality of dummy logic cells DLC may be arranged in a matrix form in a first lateral direction (X direction) and a second lateral direction (Y direction). In FIG. 1, the first lateral direction (X direction) may be referred to as a widthwise direction, and the second lateral direction (Y direction) may be referred to as a height direction.

The plurality of logic cells LC and the plurality of dummy logic cells DLC may include circuits configured to perform at least one logic function. In some embodiments, the plurality of logic cells LC and the plurality of dummy logic cells DLC may include a plurality of standard cells. In some embodiments, at least some of the plurality of logic cells LC may perform the same logic function. In some other embodiments, at least some of the plurality of logic cells LC may perform different logic functions. In example embodiments, the plurality of dummy logic cells DLC may not perform substantial electrical operations.

The plurality of logic cells LC may include various kinds of logic cells including a plurality of circuit elements. For example, each of the plurality of logic cells LC may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

The cell block 12 may include a plurality of rows R1, R2, . . . , and R6, which include the plurality of logic cells LC and the plurality of dummy logic cells DLC. In one row (e.g., the row R1) selected from the plurality of rows R1, R2, . . . , and R6, at least some of the plurality of logic cells LC and the plurality of dummy logic cells DLC, which are arranged in a line in the first lateral direction (X direction), may have the same width. In addition, the plurality of logic cells LC and the plurality of dummy logic cells DLC, which form one row, may have the same height. However, embodiments of the inventive concept are not limited to that shown in FIG. 1. At least some of the plurality of logic cells LC and the plurality of dummy logic cells DLC, which form one row, may have different widths and heights.

In example embodiments, from among the plurality of logic cells LC and the plurality of dummy logic cells DLC, which are in one row, two adjacent cells in the widthwise direction, may be apart from each other with a fin isolation region FC therebetween. In other example embodiments, the fin isolation region FC between each of the plurality of logic cells LC and each of the plurality of dummy logic cells DLC may be omitted.

The plurality of logic cells LC may include a first logic cell LC1 and a second logic cell LC2, which are adjacent to each other in one row (e.g., R1) selected from the plurality of rows R1, R2, . . . , and R6. In example embodiments, the first logic cell LC1 and the second logic cell LC2 may perform the same function. In other example embodiments, the first logic cell LC1 and the second logic cell LC2 may perform different functions.

Although the cell block 12 including six rows R1, R2, . . . , and R6 is illustrated in FIG. 1, embodiments of the inventive concept are not limited thereto. The cell block 12 may include various numbers of rows selected as needed, and one row may include various numbers of logic cells selected as needed.

Figure 2:
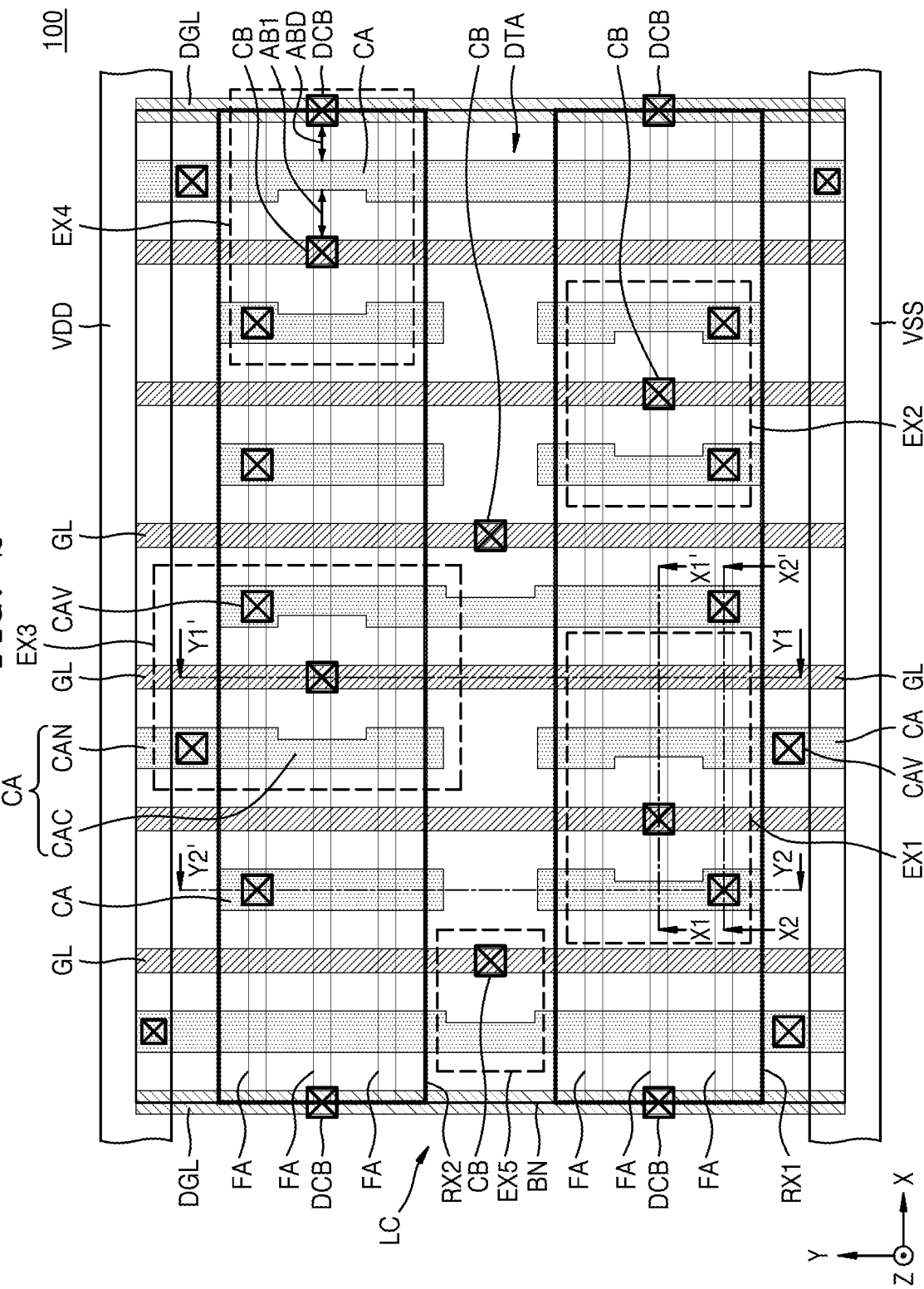
FIG. 2 is a plan layout diagram of an IC device according to embodiments of the inventive concept.
Figure 3A:
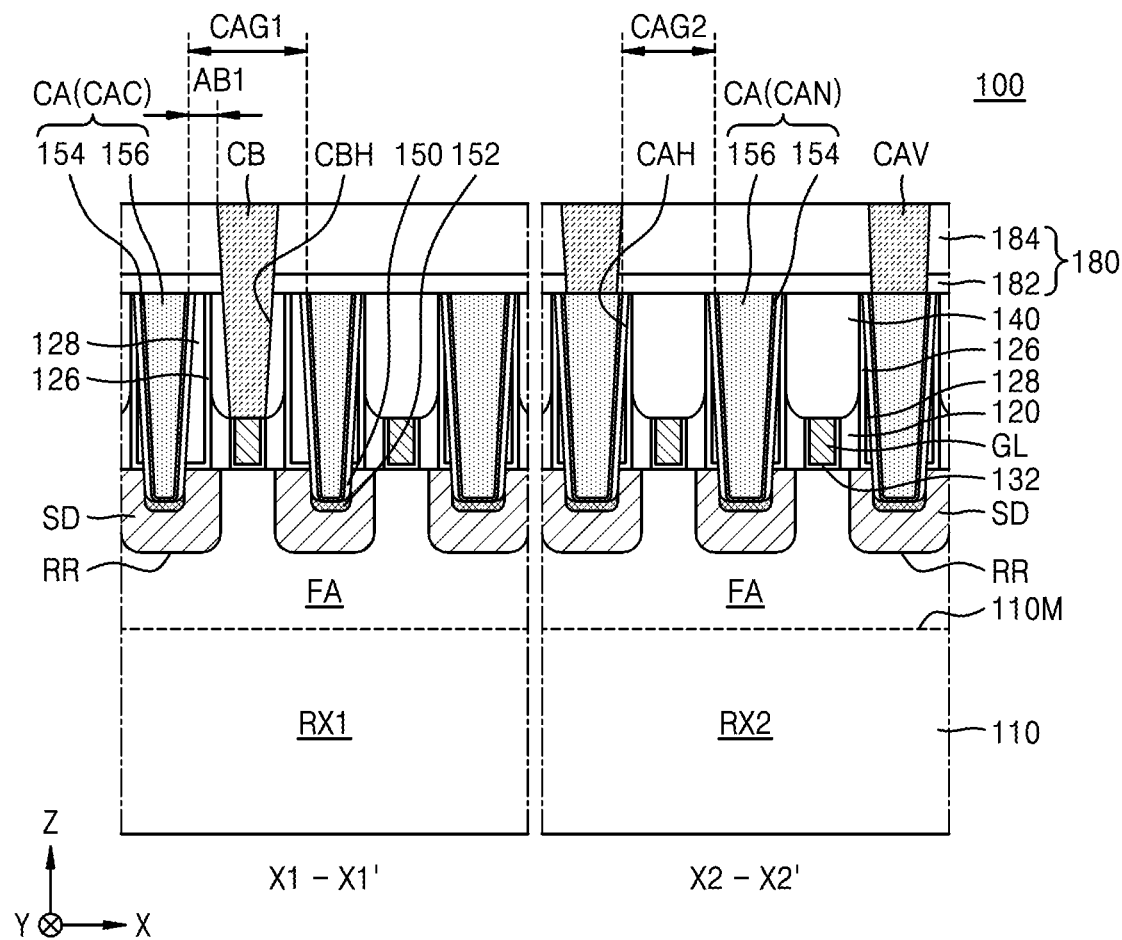
FIG. 3A is a cross-sectional view of some components corresponding to cross-sections taken along lines X1-X1' and X2-X2' of FIG. 2.
Figure 3B:
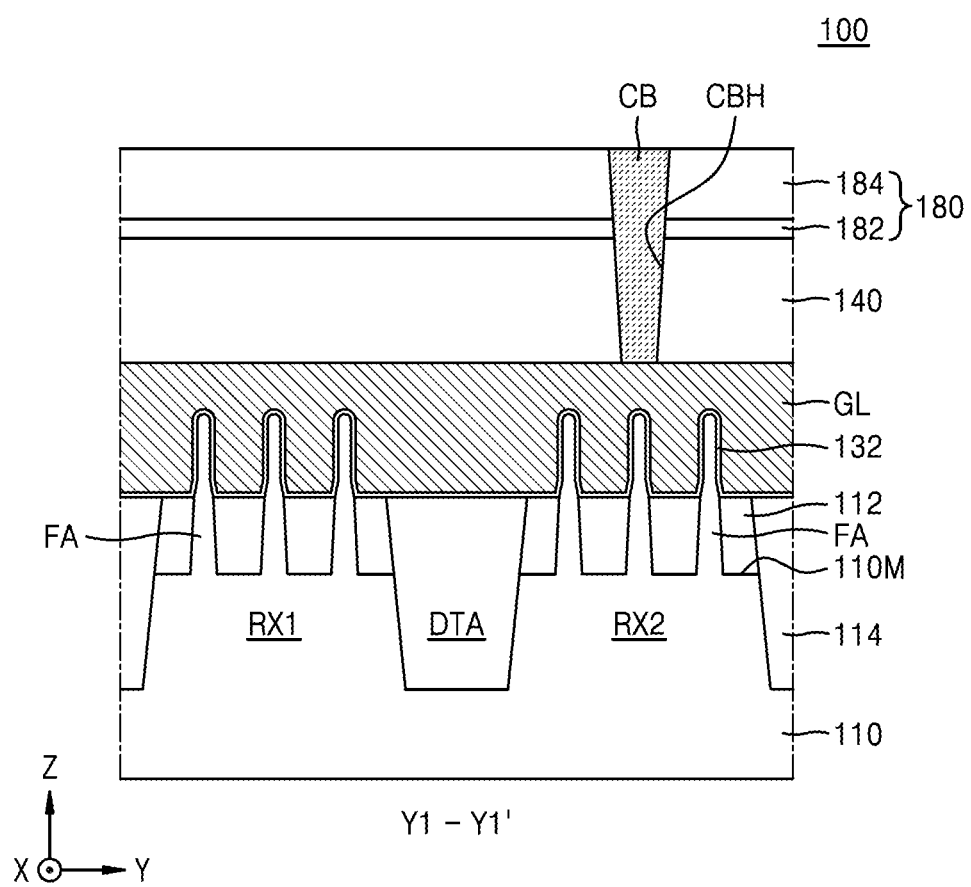
FIG. 3B is a cross-sectional view of some components corresponding to a cross-section taken along line Y1-Y1' of FIG. 2.
Figure 3C:
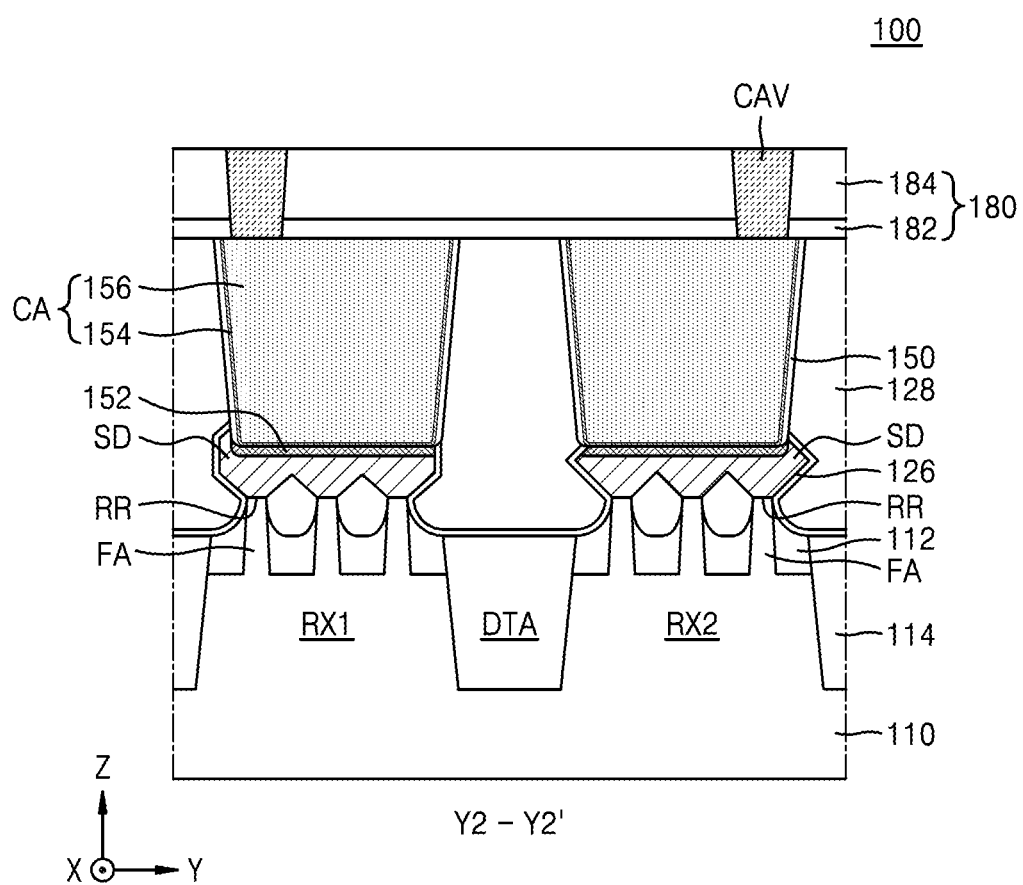
FIG. 3C is a cross-sectional view of some components corresponding to a cross-section taken along line Y2-Y2' of FIG. 2.
Figure 3D:
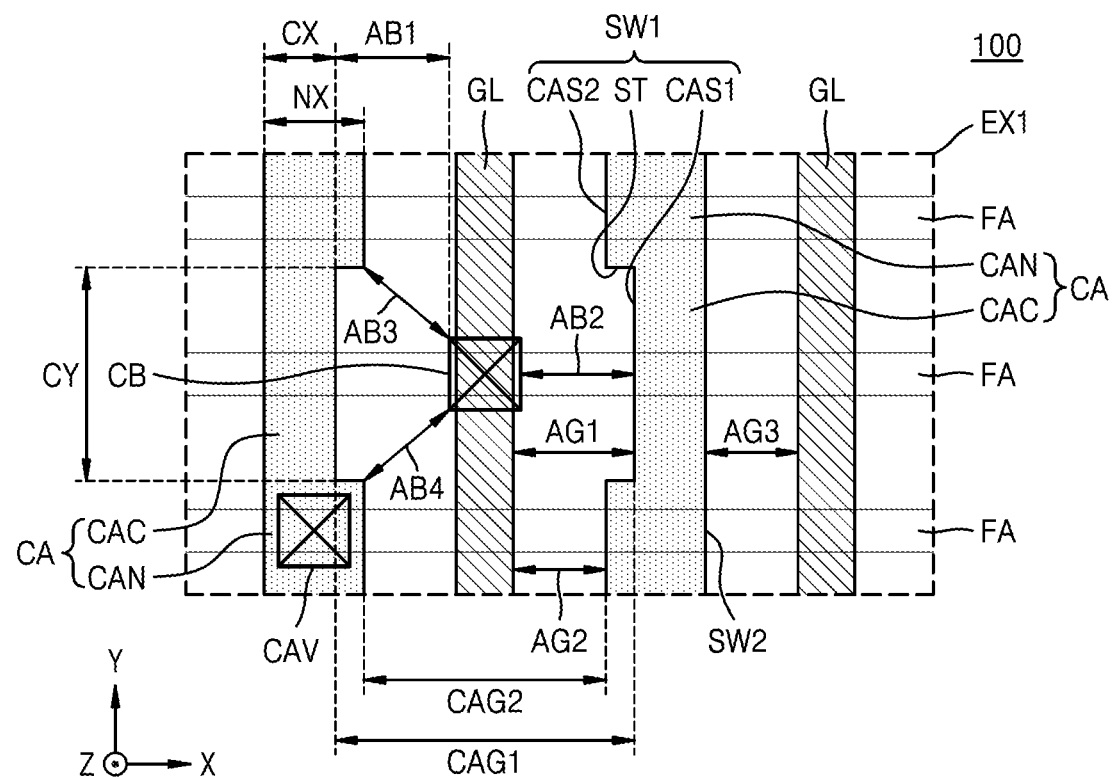
FIG. 3D is an enlarged plan view of a region "EX1" in FIG. 2.

FIG. 2 is a plan layout diagram of an IC device 100 according to embodiments of the inventive concept. FIGS. 3A to 3C are cross-sectional views of the IC device 100, according to embodiments. FIG. 3A is a cross-sectional view of some components corresponding to cross-sections taken along lines X1-X1' and X2-X2' of FIG. 2. FIG. 3B is a cross-sectional view of some components corresponding to a cross-section taken along line Y1-Y1' of FIG. 2. FIG. 3C is a cross-sectional view of some components corresponding to a cross-section taken along line Y2-Y2' of FIG. 2. FIG. 3D is an enlarged plan view of a region "EX1" in FIG. 2.

Referring to FIGS. 2 and 3A to 3D, the IC device 100 may include a logic cell including a fin field effect transistor (FinFET) device. The IC device 100 may include a logic cell LC formed in a region defined by a cell boundary BN on a substrate 110. The logic cell LC shown in FIG. 2 may constitute the cell block 12 shown in FIG. 1.

The substrate 110 may have a main surface 110M, which extends in a lateral direction (or X-Y plane direction). The substrate 110 may include a semiconductor, such as silicon (Si) or germanium (Ge), or a compound semiconductor, such as silicon germanium (SiGe), silicon carbide (SiC), gallium arsenide (GaAs), indium arsenide (InAs), or indium phosphide (InP). The substrate 110 may include a conductive region, for example, a doped well or a doped structure.

As shown in FIGS. 2 and 3A to 3C, the substrate 110 included in the logic cell LC may include a first device region RX1 and a second device region RX2. A plurality of fin-type active regions FA may be formed in each of the first device region RX1 and the second device region RX2 and protrude from the substrate 110. An inter-device isolation region DTA may be between the first device region RX1 and the second device region RX2.

A plurality of fin-type active regions FA may extend in a widthwise direction of the logic cell LC, that is, a first lateral direction (X direction). As shown in FIGS. 3B and 3C, a device isolation film 112 may be formed on the substrate 110 between the plurality of fin-type active regions FA, and an inter-device isolation insulating film 114 may be formed on the substrate 110 in the inter-device isolation region DTA. Each of the device isolation film 112 and the inter-device isolation insulating film 114 may include an oxide film. In the first device region RX1 and the second device region RX2, the plurality of fin-type active regions FA may protrude as a fin type over the device isolation film 112.

A plurality of gate insulating films 132 and a plurality of gate lines GL may extend in a height direction of the logic cell LC (i.e., a second lateral direction (Y direction)), which is a direction intersecting with the plurality of fin-type active regions FA, on the substrate 110. The plurality of gate insulating films 132 and the plurality of gate lines GL may be on and at least partially cover a top surface and both sidewalls of each of the plurality of fin-type active regions FA, a top surface of the device isolation film 112, and a top surface of the inter-device isolation insulating film 114.

A plurality of MOS transistors may be formed along the plurality of gate lines GL in the first device region RX1 and the second device region RX2. Each of the plurality of MOS transistors may be a three-dimensional (3D) metal-oxide-semiconductor (MOS) transistor of which a channel is formed in the top surface and both the sidewalls of one of the plurality of fin-type active regions FA.

A dummy gate line DGL may extend along the cell boundary BN, which extends in the second lateral direction (Y direction). The dummy gate line DGL may include the same material as the plurality of gate lines GL. The dummy gate line DGL may be maintained in an electrical floating state during an operation of the IC device 100. The dummy gate line DGL may serve as an electrical isolation region between the logic cell LC and other logic cells adjacent thereto.

The plurality of gate lines GL and a plurality of dummy gate lines DGL may have the same width in the first lateral direction (X direction) and be arranged at a constant pitch in the first lateral direction (X direction).

Each of the plurality of gate insulating films 132 may include a silicon oxide film, a high-k dielectric film, or a combination thereof. The high-k dielectric film may include a material having a higher dielectric constant than a silicon oxide film. The high-k dielectric film may include a metal oxide or a metal oxynitride. An interface film (not shown) may be between the fin-type active region FA and the gate insulating film 132. The interface film may include an oxide film, a nitride film, or an oxynitride film.

Each of the plurality of gate lines GL and the plurality of dummy gate lines DGL may have a structure in which a metal nitride layer, a metal layer, a conductive capping layer, and a gap-fill metal film are sequentially stacked. The metal nitride layer and the metal layer may include one or more metals, such as, but not limited to, titanium (Ti), tantalum (Ta), tungsten (W), ruthenium (Ru), niobium (Nb), molybdenum (Mo), and hafnium (Hf). The gap-fill metal film may include a tungsten (W) film or an aluminum (Al) film. The plurality of gate lines GL and the plurality of dummy gate lines DGL may each include a work-function metal-containing layer. The work-function metal-containing layer may include at least one metal selected from titanium (Ti), tungsten (W), ruthenium (Ru), niobium (Nb), molybdenum (Mo), platinum (Pt), ytterbium (Yb), terbium (Tb), dysprosium (Dy), erbium (Er), and/or palladium (Pd). In some embodiments, each of the plurality of gate lines GL and the plurality of dummy gate lines DGL may include a stack structure of TiAlC/TiN/W, a stack structure of TiN/TaN/TiAlC/TiN/W, or a stack structure of TiN/TaN/TiN/TiAlC/TiN/W, without being limited thereto.

A plurality of insulating spacers 120 may respectively at least partially cover both sidewalls of the plurality of gate lines GL and the plurality of dummy gate lines DGL. Each of the plurality of insulating spacers 120 may extend in a line shape in the second lateral direction (Y direction), which is a lengthwise direction of the logic cell LC. The plurality of insulating spacers 120 may each include a silicon nitride film, a silicon oxycarbonitride (SiOCN) film, a silicon carbonitride (SiCN) film, or a combination thereof, without being limited thereto.

A top surface of each of the plurality of gate lines GL, the plurality of gate insulating films 132, the plurality of insulating spacers 120, and the plurality of dummy gate lines DGL may be at least partially covered by an insulating capping line 140. A plurality of insulating capping lines 140 may include a silicon nitride film.

A plurality of recess regions RR may be formed on both sides of each of the gate lines GL in the top surfaces of the plurality of fin-type active regions FA, and a plurality of source/drain regions SD may be formed in the plurality of recess regions RR. The gate line GL and the source/drain region SD may be apart from each other with the gate insulating film 132 and the insulating spacer 120 therebetween. The plurality of source/drain regions SD may include a semiconductor epitaxial layer, which is epitaxially grown from the plurality of recess regions RR formed in the fin-type active region FA. The plurality of source/drain regions SD may include an epitaxially grown Si layer, an epitaxially grown SiC layer, and/or a plurality of epitaxially grown SiGe layers. In example embodiments, the plurality of source/drain regions SD may be at least partially covered by an insulating liner 126. The insulating liner 126 may conformally at least partially cover a surface of each of the plurality of source/drain regions SD. The insulating liner 126 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide (SiO$_2$), or a combination thereof. The insulating liner 126 may be at least partially covered by an inter-gate dielectric film 128. The inter-gate dielectric film 128 may include a silicon oxide film.

In example embodiments, the first device region RX1 may include an NMOS transistor region, while the second device region RX2 may be a PMOS transistor region. In this case, the plurality of source/drain regions SD in the first device region RX1 may include an epitaxially grown Si layer or an epitaxially grown SiC layer, while the plurality of source/drain regions SD in the second device region RX2 may include a plurality of epitaxially grown SiGe layers. As shown in FIG. 3C, the plurality of source/drain regions SD in the first device region RX1 may have different shapes and sizes from the plurality of source/drain regions SD in the second device region RX2. However, embodiments of the inventive concept are not limited thereto, and a plurality of source/drain regions SD having various shapes and sizes may be used in the first device region RX1 and the second device region RX2.

A plurality of source/drain contacts CA may be formed in the plurality of source/drain regions SD. Each of the plurality of source/drain contacts CA may be inside a source/drain contact hole CAH, which passes through the inter-gate dielectric film 128 and the insulating liner 126 in a vertical direction (Z direction), and may be connected to at least one of the plurality of source/drain regions SD.

The plurality of source/drain regions SD may be connected to upper conductive lines (not shown) through the plurality of source/drain contacts CA. Each of the plurality of source/drain contacts CA may include a conductive barrier film 154 and a metal plug 156. The conductive barrier film 154 may border or surround a sidewall and a bottom surface of the metal plug 156. A metal silicide film 152 may be formed between the source/drain region SD and the source/drain contact CA.

In example embodiments, the metal silicide film 152 may include titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). For example, the metal silicide film 152 may include titanium silicide. The conductive barrier film 154 may include titanium (Ti), tantalum (Ta), titanium nitride (TiN), tantalum nitride (TaN), or a combination thereof, and the metal plug 156 may include tungsten (W), cobalt (Co), copper (Cu), ruthenium (Ru), manganese (Mn), or a combination thereof.

Sidewalls of each of the plurality of source/drain contacts CA may be at least partially covered by a contact insulating spacer 150. In example embodiments, the contact insulating spacer 150 may include silicon carbonitride (SiCN), silicon carbon oxynitride (SiCON), silicon nitride (SiN), or a combination thereof, without being limited thereto.

A width of at least one of the plurality of source/drain contacts CA in the first lateral direction (X direction) may vary according to a position. A width of each of the plurality of source/drain contacts CA, which extends in the first lateral direction (X direction), may be variable in the second lateral direction (Y direction).

As shown in FIGS. 2 and 3D, at least one of the plurality of source/drain contacts CA may include a first segment CAC and a second segment CAN, which have different widths in the first lateral direction (X direction) and are integrally or monolithically connected to each other. The second segment CAN may extend from the first segment CAC in the second lateral direction (Y direction). The first segment CAC may have a first width CX in the first lateral direction (X direction), and the second segment CAN may have a second width NX in the first lateral direction (X direction). The first width CX of the first segment CAC may be less than the second width NX of the second segment CAN.

The IC device 100 may include an insulating structure 180, which at least partially covers a top surface of each of the plurality of source/drain contacts CA, the plurality of insulating capping lines 140, and the inter-gate dielectric film 128. The insulating structure 180 may include an etch stop film 182 and an interlayer insulating film 184, which are sequentially stacked on the source/drain contact CA. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 may include an oxide film, a nitride film, an ultralow-k (ULK) film having an ultralow dielectric constant K of about 2.2 to about 2.4, or a combination thereof. For example, the interlayer insulating film 184 may include a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof.

A plurality of via contacts CAV may be formed on the plurality of source/drain contacts CA. Each of the plurality of via contacts CAV may pass through the insulating structure 180 and be in physical contact with the top surface of the source/drain contact CA.

A plurality of gate contacts CB may be formed on the plurality of gate lines GL. Each of the plurality of gate contacts CB may be inside a gate contact hole CBH, which passes through the insulating capping line 140 and the insulating structure 180 in the vertical direction (Z direction), and connected to a local connection on a top surface of the gate line GL.

The plurality of via contacts CAV and the plurality of gate contacts CB may each include a buried metal film and a conductive barrier film bordering or surrounding the buried metal film. The buried metal film may include cobalt (Co), copper (Cu), tungsten (W), ruthenium (Ru), manganese (Mn), or a combination thereof, and the conductive barrier film may include titanium (Ti), tantalum (Ta), titanium nitride (TiN), tantalum nitride (TaN), or a combination thereof. Sidewalls of each of the plurality of via contacts CAV and the plurality of gate contacts CB may be at least partially covered by an insulating liner (not shown). The insulating liner may include a silicon nitride film, without being limited thereto.

From among the plurality of source/drain contacts CA, the source/drain contact CA including the first segment CAC and the second segment CAN may be adjacent to the gate line GL to which the gate contact CB is connected, in the first lateral direction (X direction). The first segment CAC of the source/drain contact CA may face the gate line GL and the gate contact CB connected to the gate line GL.

As shown in FIG. 3D, the source/drain contact CA including the first segment CAC and the second segment CAN may include a first outer sidewall SW1 and a second outer sidewall SW2, which are on both sides in the first lateral direction (X direction). The first outer sidewall SW1 may face one gate line GL selected from the plurality of gate lines GL and the gate contact CB connected thereto. The second outer sidewall SW2, which is opposite to the first outer sidewall SW1, may face another gate line GL adjacent to the selected gate line GL. The first outer sidewall SW1 and the second outer sidewall SW2 may be mutually asymmetric about a reference line passing through the source/drain contact CA in the second lateral direction (Y direction).

In the first outer sidewall SW1, a surface of the first segment CAC may be offset from a surface of the second segment CAN in the first lateral direction (X direction). A direction in which the surface of the first segment CAC is offset may be a direction away from the gate contact CB in the first lateral direction (X direction). In the second outer sidewall SW2, the surface of the first segment CAC and the surface of the second segment CAN may be in a straight line in the second lateral direction (Y direction). In the second outer sidewall SW2, the surface of the first segment CAC and the surface of the second segment CAN may be on one plane.

In the first segment CAC of the source/drain contact CA, a first distance AG1 from the first segment CAC to the selected gate line GL in the first lateral direction (X direction) may be greater than a second distance AG2 from the second segment CAN to the selected gate line GL in the first lateral direction (X direction). A third distance AG3 from the second outer sidewall SW2 of the source/drain contact CA to the other gate line GL, which faces the second outer sidewall SW2, may be less than the first distance AG1 and equal or similar to the second distance AG2.

The first outer sidewall SW1 of the source/drain contact CA including the first segment CAC and the second segment CAN may include a recessed sidewall portion CAS1, a normal sidewall portion CAS2, and a stepped portion ST. The recessed sidewall portion CAS1 may be included in the first segment CAC and face the gate contact CB. The normal sidewall portion CAS2 may be included in the second segment CAN and may not face the gate contact CB. The stepped portion ST may be between the recessed sidewall portion CAS1 and the normal sidewall portion CAS2. A distance from the recessed sidewall portion CAS1 to the selected gate line GL in the first lateral direction (X direction) may be greater than a distance from another portion (e.g., the normal sidewall portion CAS2) of the first outer sidewall SW1 to the selected gate line GL in the first lateral direction (X direction).

As shown in FIG. 3D, in the source/drain contact CA including the first segment CAC and the second segment CAN, a length CY of the first segment CAC in the second lateral direction (Y direction) may be greater than a length of the gate contact CB, which is adjacent to the source/drain contact CA, in the second lateral direction (Y direction).

As shown in FIGS. 3A and 3D, at least a portion of the first segment CAC of the source/drain contact CA may overlap the fin-type active region FA in the vertical direction (Z direction).

As can be seen from regions "EX1," "EX2," "EX3," and "EX4" of FIG. 2, the plurality of source/drain contacts CA may include one pair of source/drain contacts CA, which are adjacent to one gate line GL, to which the gate contact CB is connected, and are apart from each other in the first lateral direction (X direction) with the one gate line GL therebetween. Each of the pair of source/drain contacts CA may include a first segment CAC, which is adjacent to the gate contact CB connected to the one gate line GL, and a second segment CAN, which is integrally or monolithically connected to the first segment CAC and extends from the first segment CAC in the second lateral direction (Y direction). In the first lateral direction (X direction), a distance from the first segment CAC of each of the pair of source/drain contacts CA to the one gate line GL may be greater than a distance from the second segment CAN of each of the pair of source/drain contacts CA to the one gate line GL. Respective planar shapes of the first segment CAC of the pair of source/drain contacts CA may be symmetrical about the one gate line GL.

As shown in FIGS. 3A and 3D, a first interval CAG1 between the first segments CAC of the pair of source/drain contacts CA in the first lateral direction (X direction) may be greater than a second interval CAG2 between the segment segments CAN of the pair of source/drain contacts CA in the first lateral direction (X direction).

In example embodiments, as can be seen from the region "EX2" of FIG. 2, the plurality of source/drain contacts CA may include a pair of source/drain contacts CA, which are adjacent to one gate line GL, to which the gate contact CB is connected, and are apart from each other in the first lateral direction (X direction) with the one gate line GL therebetween. Respective planar shapes of the pair of source/drain contacts CA may be symmetrical about the one gate line GL.

In other example embodiments, as can be seen from the regions "EX1," "EX3," and "EX4" of FIG. 2, the plurality of source/drain contacts CA may include a pair of source/drain contacts CA, which are adjacent to one gate GL, to which the gate contact CB is connected, and are apart from each other in the first lateral direction (X direction) with the one gate line GL therebetween. Respective planar shapes of the pair of source/drain contacts CA may be asymmetrical about the one gate line GL. For example, a length of one of the pair of source/drain contacts CA in the second lateral direction (Y direction) may be a length of the other thereof. Each of the pair of source/drain contacts CA may include the first outer sidewall SW1 and the second outer sidewall SW2, which are described with reference to FIG. 3D.

As shown in FIG. 3D, lateral distances AB1, AB2, AB3, and AB4 between the gate contact CB connected to the gate line GL and the plurality of source/drain contacts CA adjacent to the gate contact CB may be at least a smallest distance for the application of an OPC fragment to an OPC model used to design a layout for forming the gate contact CB and the plurality of source/drain contacts CA.

As shown in FIG. 2, at least one dummy gate contact DCB may be on the dummy gate line DGL. The dummy gate contact DCB may have the same configuration as the gate contact CB. However, unlike the gate contact CB, the dummy gate contact DCB may not perform an electrical function used in the device.

As can be seen from the region "EX4" of FIG. 2, in one source/drain contact CA adjacent to the dummy gate contact DCB connected to the dummy gate line DGL, an outer sidewall facing the dummy gate contact DCB may planarly extend without a step in the second lateral direction (Y direction). In addition, a smallest lateral distance ABD between the one source/drain contact CA and the dummy gate contact DCB adjacent thereto may be less than a smallest lateral distance AB1 between the first segment CAC of the one source/drain contact CA and the gate contact CB adjacent thereto.

As can be seen from the region "EX5" of FIG. 2, the gate contact CB on some of the plurality of gate lines GL may be in the inter-device isolation region DTA and connected to the gate line GL in the inter-device isolation region DTA. The plurality of source/drain contacts CA may include at least one source/drain contact CA having the first segment CAC that is adjacent to the gate contact CB located on the inter-device isolation region DTA. The at least one source/drain contact CA may extend lengthwise in the second lateral direction (Y direction) over at least one of the first device region RX1 and the second device region RX2 and the inter-device isolation region DTA, and the first segment CAC of the at least one source/drain contact CA may overlap the inter-device isolation region DTA in a vertical direction (Z direction).

As shown in FIG. 2, a ground line VSS and a power line VDD may be connected to the logic cell LC. In example embodiments, the ground line VSS may be connected to the fin-type active region FA in the first device region RX1 through some of the plurality of source/drain contacts CA, and the power line VDD may be connected to the fin-type active region FA in the second device region RX2 through some others of the plurality of source/drain contacts CA. The ground line VSS and the power line VDD may be formed at a higher level than respective top surfaces of the plurality of source/drain contacts CA and the plurality of gate contacts CB. The ground line VSS and the power line VDD may include a conductive barrier film and a wiring conductive layer, respectively. The conductive barrier film may include a Ti, Ta, TiN, TaN, or a combination thereof. The wiring conductive layer may include Co, Cu, W, an alloy thereof, or a combination thereof.

A case in which the top surface of each of the plurality of source/drain contacts CA is at substantially the same level as a top surface of the insulating capping line 140 has been described as an example in the IC device 100 shown in FIGS. 2 and 3A to 3D, but the inventive concept is not limited thereto. For example, the top surface of each of the plurality of source/drain contacts CA may be at substantially the same level as a top surface of the gate contact CB. In this case, the plurality of via contacts CAV may be at a higher level than the gate contact CB relative to the substrate 110 being a base reference plane.

FIG. 2 illustrates an example in which the regions "EX1," "EX2," "EX3," "EX4," and "EX5" are included in one logic cell LC in the IC device 100 described with reference to FIGS. 2 and 3A to 3D, but embodiments of the inventive concept are not limited thereto. For example, each of the plurality of logic cells LC included in the cell block 12 of the IC device 10 shown in FIG. 1 may include at least one of the configurations of the regions "EX1," "EX2," "EX3," "EX4," and "EX5," which have been described with reference to FIG. 2.

In the IC device 100 shown in FIGS. 2 and 3A to 3D, the source/drain contact CA adjacent to the gate contact CB may include a first segment CAC having a relatively small width in the first lateral direction (X direction) and a second segment CAN having a relatively great width in the first lateral direction (X direction). In the first outer sidewall SW1 of the source/drain contact CA, which faces the gate contact CB, a surface of the first segment CAC may be offset from a surface of the second segment CAN in the first lateral direction (X direction), and a direction in which the surface of the first segment CAC is offset may be a direction away from the gate contact CB in the first lateral direction (X direction). Accordingly, a sufficient insulation distance between the source/drain contact CA and the gate contact CB may be obtained. As a result, an undesired parasitic capacitance between the source/drain contact CA and the gate contact CB may be reduced, and thus, the reliability of the IC device 100 may be improved.

Figure 4:
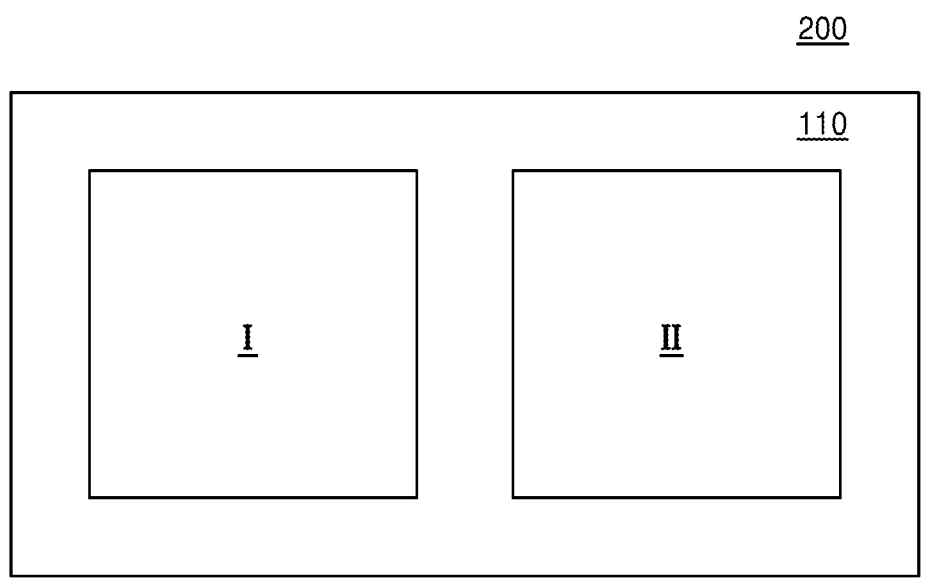
FIG. 4 is a block diagram of an IC device according to embodiments of the inventive concept.

FIG. 4 is a block diagram of an IC device 200 according to some embodiments of the inventive concept.

Referring to FIG. 4, the IC device 200 may include a substrate 110 including a first region I and a second region II. The first region I and the second region II of the substrate 110 may refer to different regions of the substrate 110 and may be regions configured to perform different operations on the substrate 110. The first region I and the second region II may be apart from each other in a lateral direction.

In example embodiments, the first region I may be a region in which devices configured to operate in a low-power mode are formed, while the second region II may be a region in which devices configured to operate in a high-power mode are formed. In other example embodiments, the first region I may be a region in which a memory device or a non-memory device is formed, while the second region II may be a region in which a peripheral circuit (e.g., an input/output (I/O) device) is formed.

In example embodiments, each of the first region I and the second region II may constitute a volatile memory device, such as dynamic random access memory (DRAM) and static RAM (SRAM), or a non-volatile memory device, such as read-only memory (ROM), mask ROM (MROM), programmable ROM (PROM), erasable programmable ROM (EPROM), electrically erasable programmable ROM (EEPROM), ferromagnetic ROM (FROM), phase-change RAM (PRAM), magnetic RAM (MRAM), resistive RAM (RRAM), and flash memory. In other example embodiments, each of the first region I and the second region II may be a region in which a non-memory device (e.g., a logic device) is formed. The logic device may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch.

In the IC device 200, a pattern density of the second region II may be lower than a pattern density of the first region I. In example embodiments, the first region I may include the same structures as those included in the IC device 100 described with reference to FIGS. 3A to 3D.

Figure 5:
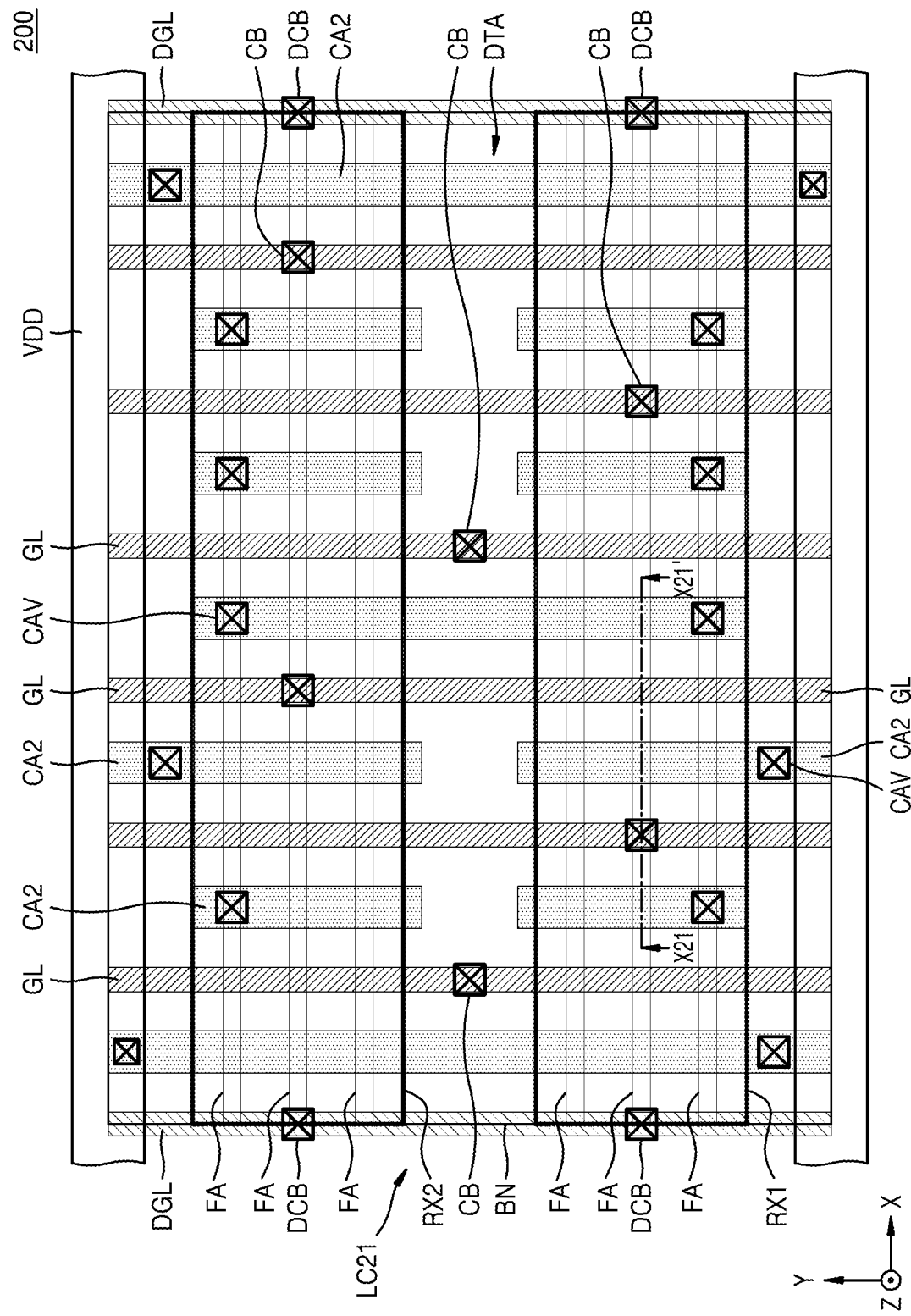
FIG. 5 is a plan layout diagram of a configuration of a logic cell included in a second region of the IC device shown in FIG. 4.
Figure 6:
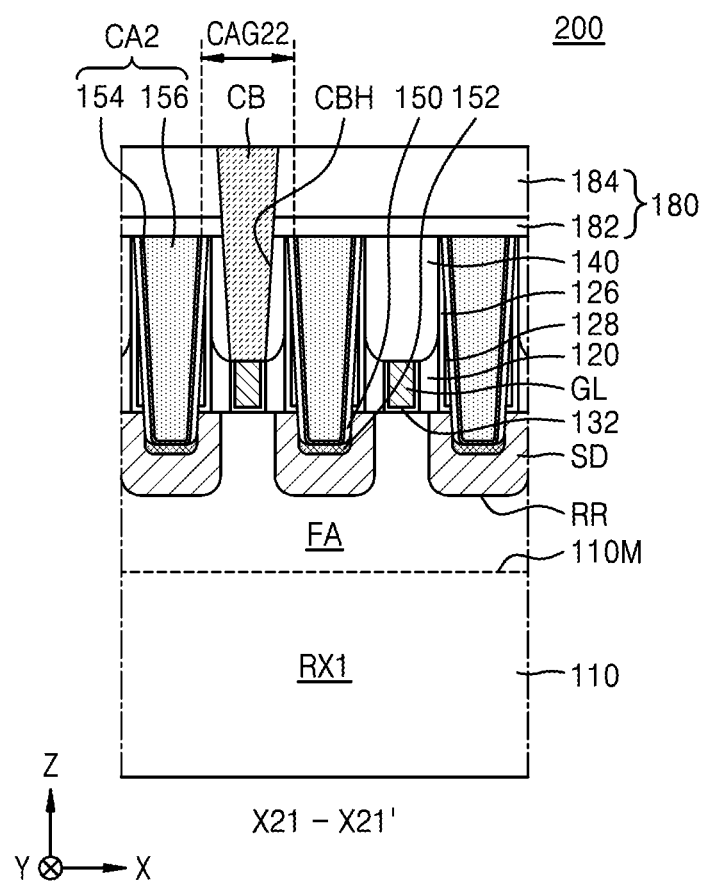
FIG. 6 is a cross-sectional view of some components corresponding to a cross-section taken along line X21-X21' of FIG. 5.

FIG. 5 is a plan layout diagram of a configuration of a logic cell LC21 included in the second region II of the IC device 200 shown in FIG. 4. FIG. 6 is a cross-sectional view of some components corresponding to a cross-section taken along line X21-X21' of FIG. 5.

Referring to FIGS. 5 and 6, the logic cell LC21 of the IC device 200 may have substantially the same configuration as the logic cell LC of the IC device 100, which has been described above with reference to FIGS. 2 and 3A to 3D. However, the logic cell LC21 of the IC device 200 may include a plurality of source/drain contacts CA2 instead of the plurality of source/drain contacts CA. Unlike the plurality of source/drain contacts CA described with reference to FIGS. 2 and 3A to 3D, the plurality of source/drain contacts CA2 may not include a first segment CAC, which has a relatively small width in a first lateral direction (X direction). An outer sidewall of the source/drain contact CA2, which faces the gate contact CB, may planarly extend without a step in a second lateral direction (Y direction).

As shown in FIG. 6, the plurality of source/drain contacts CA2 may include a pair of source/drain contacts CA2, which are adjacent to one gate line CB, to which the gate contact CB is connected, and are apart from each other in the first lateral direction (X direction) with the one gate line GL therebetween. A distance CAG22 between the pair of source/drain contacts CA in the first lateral direction (X direction) may be approximately constant in the second lateral direction (Y direction) regardless of a position of the gate contact CB.

Figure 7:
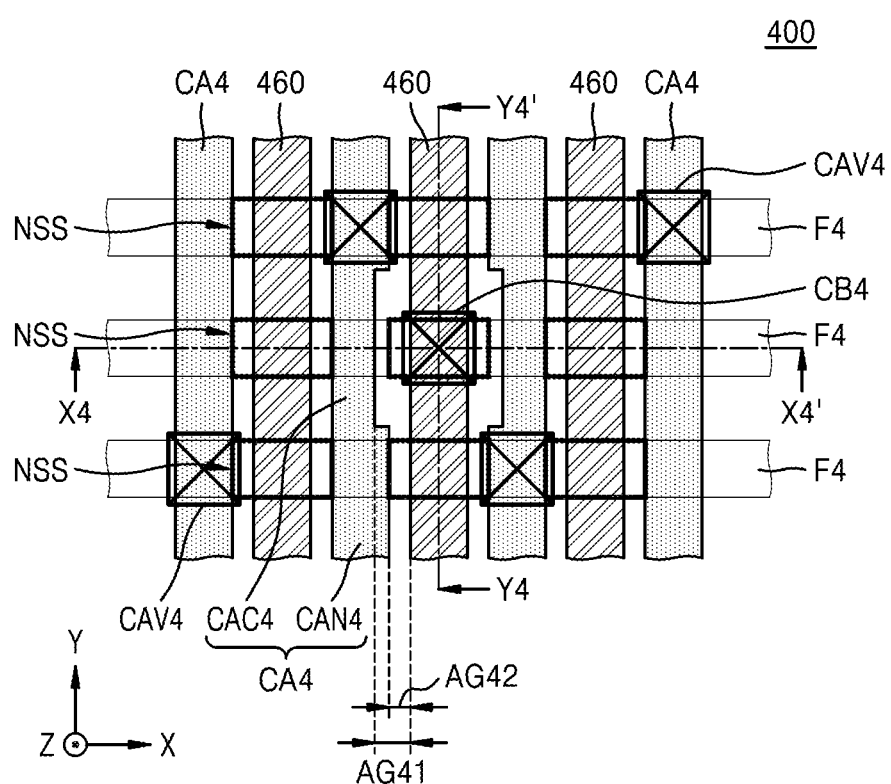
FIG. 7 is a plan layout diagram of some components of an IC device according to embodiments of the inventive concept.
Figure 8A:
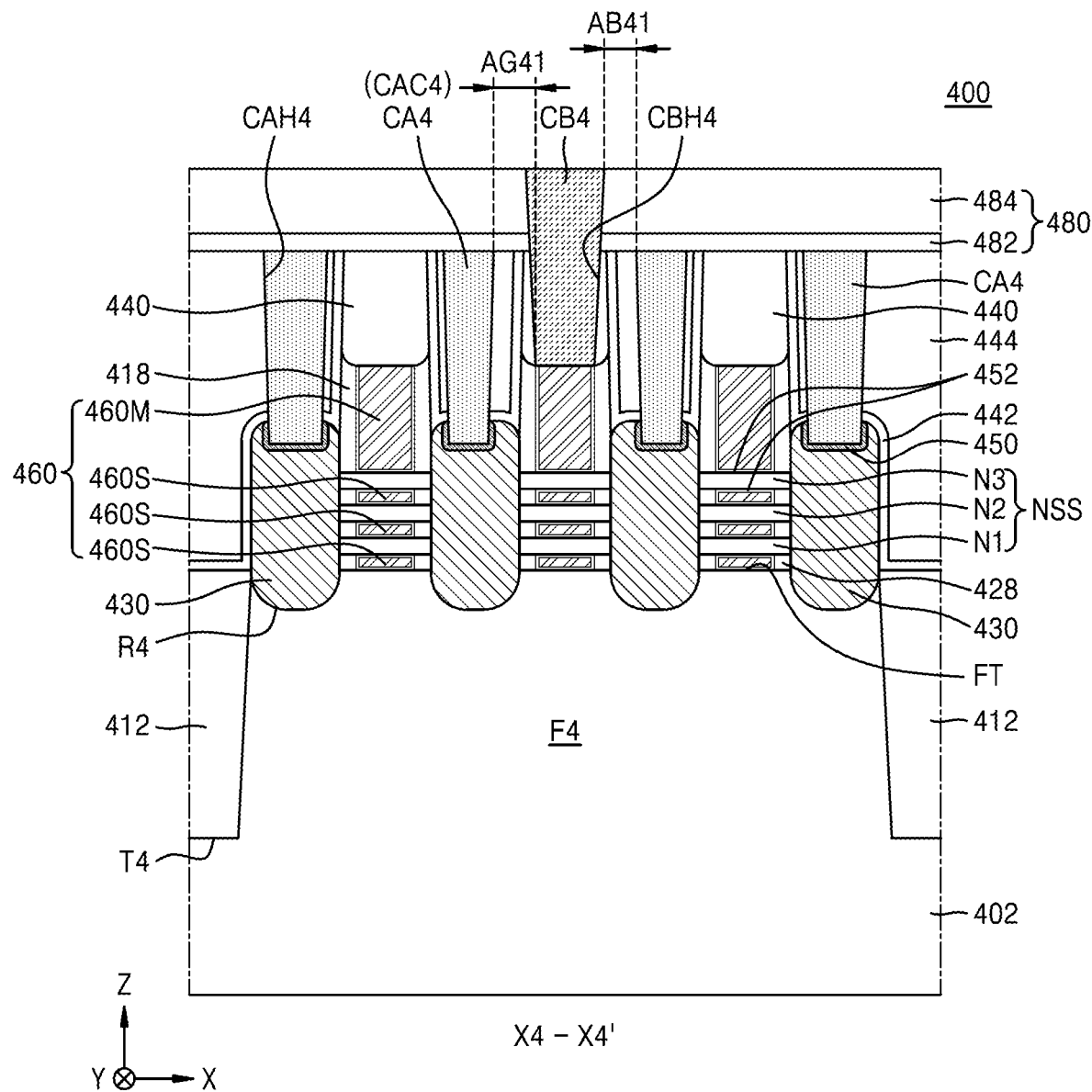
FIG. 8A is a cross-sectional view taken along a line X4-X4' of FIG. 7.

FIG. 7 is a plan layout diagram of some components of an IC device, according to embodiments of the inventive concept. FIG. 8A is a cross-sectional view taken along line X4-X4' of FIG. 7, and FIG. 8B is a cross-sectional view taken along a line Y4-Y4' of FIG. 7.

Figure 8B:
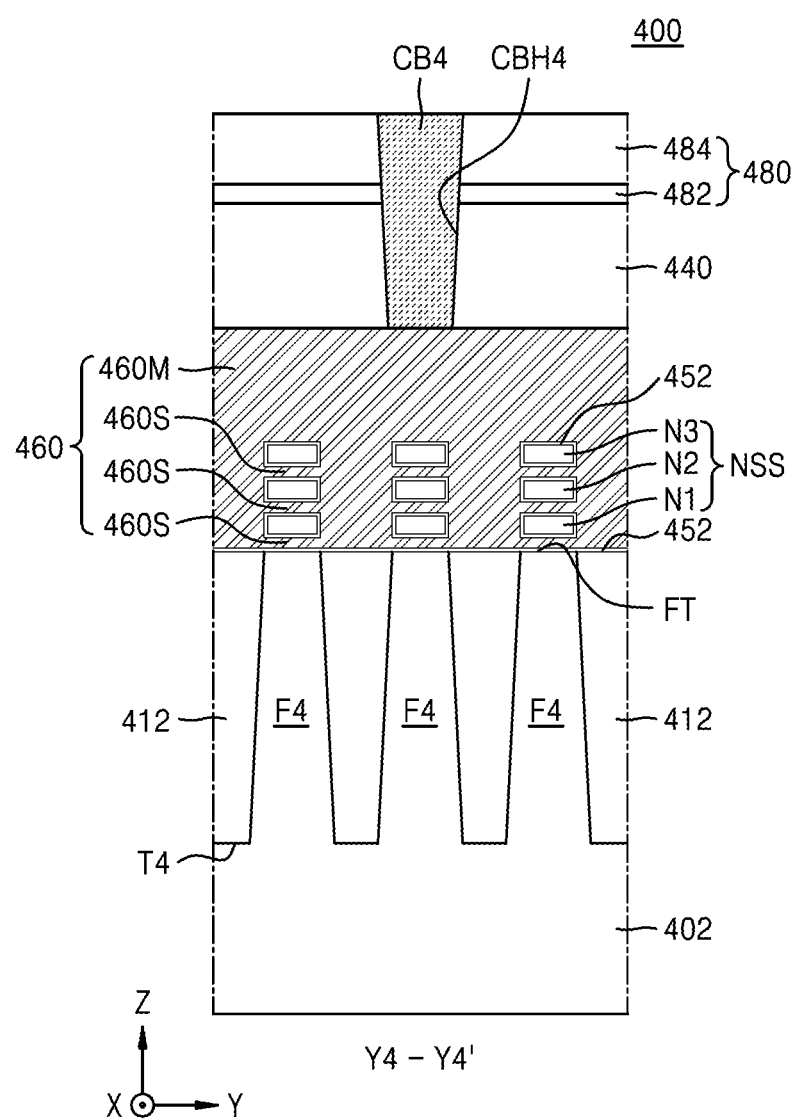
FIG. 8B is a cross-sectional view taken along a line Y4-Y4' of FIG. 7.

Referring to FIGS. 7, 8A, and 8B, the IC device 400 may include a plurality of fin-type active regions F4 and a plurality of nanosheet stacks NSS. The plurality of fin-type active regions F4 may protrude from a substrate 402 and extend lengthwise in a first lateral direction (X direction). The plurality of nanosheet stacks NSS may be apart from the plurality of fin-type active regions F4 upward in a vertical direction (Z direction) and face top surfaces FT of the plurality of fin-type active regions F4. As used herein, the term "nanosheet" refers to a conductive structure having a cross-section that is substantially perpendicular to a direction in which current flows. The nanosheet may be interpreted as including a nanowire.

Trenches T4 defining the plurality of fin-type active regions F4 may be formed in the substrate 402, and the trenches T4 may be at least partially filled with a device isolation film 412. The substrate 402, the plurality of fin-type active regions F4, and the device isolation film 412 may have the same configurations as those of the substrate 110, the fin-type active region FA, and the device isolation film 112, which are described with reference to FIGS. 3A to 3D.

A plurality of gate lines 460 may extend in a second lateral direction (Y direction) on the plurality of fin-type active regions F4. The plurality of nanosheet stacks NSS may be respectively on the top surfaces FT of the plurality of fin-type active regions F4 at intersections between the plurality of fin-type active regions F4 and the plurality of gate lines 460. Each of the plurality of nanosheet stacks NSS may be apart from the fin-type active region F4 and face the top surface FT of the fin-type active region F4. A plurality of nanosheet transistors may be formed at intersections between the plurality of fin-type active regions F4 and the plurality of gate lines 460 on the substrate 402.

Each of the plurality of nanosheet stacks NSS may include a plurality of nanosheets (e.g., N1, N2, and N3), which overlap each other in the vertical direction (Z direction) on the top surface FT of the fin-type active region F4. The plurality of nanosheets may include a first nanosheet N1, a second nanosheet N2, and a third nanosheet N3, which are at different distances from the top surface FT of the fin-type active region F4.

FIG. 7 illustrates an example embodiment in which the nanosheet stack NSS has an approximately rectangular planar shape, without being limited thereto. The nanosheet stack NSS may have various planar shapes according to a planar shape of each of the fin-type active region F4 and the gate line 460. The present example embodiment pertains to an example configuration in which the plurality of nanosheet stacks NSS and the plurality of gate lines 460 are formed on one fin-type active region F4, and the plurality of nanosheet stacks NSS are arranged in a line in the first lateral direction (X direction) on one fin-type active region F4. However, according to various embodiments of the inventive concept, the number of nanosheet stacks NSS on one fin-type active region F4 is not specifically limited. For example, one nanosheet stack NSS may be formed on one fin-type active region F4. The present example embodiment pertains to a case in which each of the plurality of nanosheet stacks NSS includes three nanosheets, but embodiments of the inventive concept are not limited thereto. For example, the nanosheet stack NSS may include at least one nanosheet, and the number of nanosheets included in the nanosheet stack NSS is not specifically limited.

Each of the first to third nanosheets N1, N2, and N3 may have a channel region. In example embodiments, each of the first to third nanosheets N1, N2, and N3 may include a Si layer, a SiGe layer, or a combination thereof.

A plurality of recess regions R4 may be formed in an upper portion of the fin-type active region F4, and a plurality of source/drain regions 430 may be formed on the plurality of recess regions R4. The plurality of source/drain regions 430 may include an epitaxially grown semiconductor layer. A detailed configuration of each of the plurality of source/drain regions 430 may be substantially the same as the source/drain region SD shown in FIGS. 3A and 3B.

The gate line 460 may border or surround each of the first to third nanosheets N1, N2, and N4 while at least partially covering the nanosheet stack NSS on the fin-type active region F4. Each of the plurality of gate lines 460 may include a main gate portion 460M and a plurality of sub-gate portions 460S. The main gate portion 460M may at least partially cover the top surface of the nanosheet stack NSS and extend lengthwise in the second lateral direction (Y direction). The plurality of sub-gate portions 460S may be integrally or monolithically connected to the main gate portion 460M and respectively arranged between the first to third nanosheets N1, N2, and N3 and between the fin-type active region F4 and the first nanosheet N1. Each of the first to third nanosheets N1, N2, and N3 may have a gate-all-around (GAA) structure bordered or surrounded by the gate line 460. The gate line 460 may include a metal, a metal nitride, a metal carbide, or a combination thereof. The metal may include one or more metals including, but not limited to, Ti, W, Ru, Nb, Mo, Hf, Ni, Co, Pt, Yb, Tb, Dy, Er, and/or Pd. The metal nitride may TiN and/or TaN. The metal carbide may include titanium aluminum carbide (TiAlC). A gate insulating film 452 may be between the nanosheet stack NSS and the gate line 460. The gate insulating film 452 may have substantially the same configuration as the gate insulating film 132 shown in FIGS. 3A and 3B.

A metal silicide film 450 may be formed on a top surface of each of the plurality of source/drain regions 430. The metal silicide film 450 may have substantially the same configuration as the metal silicide film 152 shown in FIGS. 3A and 3B. The metal silicide film 450 may be omitted in some embodiments.

Both sidewalls of the plurality of gate lines 460 may be respectively at least partially covered by a plurality of outer insulating spacers 418. The plurality of outer insulating spacers 418 may at least partially cover both sidewalls of the main gate portion 460M on the plurality of nanosheet stacks NSS. The plurality of outer insulating spacers 418 and the plurality of source/drain regions 430 may be at least partially covered by an insulating liner 442. Each of the outer insulating spacers 418 and the insulating liner 442 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide (SiO$_2$), or a combination thereof. The insulating liner 442 may be omitted in some embodiments.

A plurality of inner insulating spacers 428 may be between the first to third nanosheets N1, N2, and N3 and between the fin-type active region F4 and the first nanosheet N1. Both sidewalls of each of the plurality of sub-gate portions 460S may be at least partially covered by the inner insulating spacers 428 with the gate insulating film 452 therebetween. The plurality of inner insulating spacers 428 may be between the plurality of sub-gate portions 460S and the source/drain region 430. In example embodiments, the outer insulating spacers 418 and the inner insulating spacers 428 may include the same insulating material. In other example embodiments, the outer insulating spacers 418 may include a different material from the inner insulating spacers 428. The inner insulating spacers 428 may include SiN, SiCN, SiBN, SiON, SiOCN, SiBCN, SiOC, $SiO_2$, or a combination thereof. The inner insulating spacers 428 may further include air gaps. In example embodiments, the plurality of inner insulating spacers 428 may be omitted.

The insulating liner 442 may be at least partially covered by an inter-gate dielectric film 444. The inter-gate dielectric film 444 may include a silicon oxide film. A plurality of source/drain contacts CA4 may be inside a plurality of contact holes CAH4, which pass through the inter-gate dielectric film 444 and the insulating liner 442. Each of the plurality of source/drain contacts CA4 may be connected to the source/drain region 430 through the metal silicide film 450. Each of the plurality of source/drain contacts CA4 may include a metal, a conductive metal nitride, or a combination thereof.

Each of the plurality of source/drain contacts CA4 may have substantially the same configuration as the source/drain contact CA described with reference to FIGS. 3A, 3C, and 3D. A width of each of the plurality of source/drain contacts CA4 in the first lateral direction (X direction) may vary according to a position. A width of each of the plurality of source/drain contacts CA4, which extends in the first lateral direction (X direction), may be variable in the second lateral direction (Y direction).

As shown in FIG. 7, at least one of the plurality of source/drain contacts CA4 may include a first segment CAC4 and a second segment CAN4, which have different widths in the first lateral direction (X direction) and are integrally or monolithically connected to each other. The second segment CAN4 may extend from the first segment CAC4 in the second lateral direction (Y direction). In the first lateral direction (X direction), a width of the first segment CAC4 may be less than a width of the second segment CAN.

Each of the plurality of gate lines 460 may be at least partially covered by an insulating capping line 440. The insulating capping line 440 may have substantially the same configuration as the insulating capping line 140 shown in FIGS. 3A and 3B.

The IC device 400 may include an insulating structure 480, which at least partially covers a top surface of each of the plurality of source/drain contacts CA4, a plurality of insulating capping lines 440, and the inter-gate dielectric film 444. The insulating structure 480 may include an etch stop film 482 and an interlayer insulating film 484, which are sequentially stacked on the source/drain contact CA4. The etch stop film 482 and the interlayer insulating film 484 may respectively have substantially the same configurations as the etch stop film 182 and the interlayer insulating film 184 described with reference to FIGS. 3A to 3C. A plurality of via contacts CAV4 may be formed on the plurality of source/drain contacts CA4. Each of the plurality of via contacts CAV4 may pass through the insulating structure 480 and be in physical contact with a top surface of the source/drain contact CA4. The plurality of via contacts CAV4 may have substantially the same configuration as the plurality of via contacts CAV described with reference to FIGS. 2, 3A, 3C, and 3D.

A gate contact CB4 may be formed on the gate line 460. The gate contact CB4 may be inside a gate contact hole CBH4, which passes through the insulating structure 480 and the insulating capping line 440 in the vertical direction (Z direction). Also, the gate contact CB4 may be connected to a local connection of a top surface of the gate line 460. A detailed configuration of the gate contact CB4 may be substantially the same as that of the gate contact CB described with reference to FIGS. 2, 3B, and 3D.

From among the plurality of source/drain contacts CA4, the source/drain contact CA4 including the first segment CAC4 and the second segment CAN4 may be adjacent to the gate line 460 to which the gate contact CB4 is connected in the first lateral direction (X direction). The first segment CAC4 of the source/drain contact CA4 may face the gate line 460 and the gate contact CB4 connected thereto.

Detailed descriptions of the gate contact CB4, the gate line 460 to which the gate contact CB4 is connected, and the source/drain contact CA4, which is adjacent to the gate contact CB4 and includes the first segment CAC4 and the second segment CAN4, may be substantially the same as those of the gate contact CB, the gate line GL to which the gate contact CB is connected, and the source/drain contact CA, which is adjacent to the gate contact CB and includes the first segment CAC and the second segment CAN, which are given with reference to FIGS. 2 and 3A to 3D.

As shown in FIG. 8A, an interval AG41 between the gate line 460, to which the gate contact CB4 is connected, and the first segment CAC4 of the source/drain contact CA4, which is adjacent to the gate contact CB4, in a first lateral direction (X direction) may be greater than an interval AG42 between the gate line 450, to which the gate contact CB4 is connected, and the second segment CAN4 of the source/drain contact CA4, which is adjacent to the gate contact CB4, in the first lateral direction (X direction). As shown in FIG. 8A, a lateral distance AB41 between the gate contact CB4, to which the gate line 460 is connected, and the source/drain contact CA adjacent to the gate contact CB4 may be at least a smallest distance for the application of an OPC fragment to an OPC model used to design a layout for forming the gate contact CB4 and the source/drain contact CA4.

In the IC device 400 described with reference to FIGS. 7, 8A, and 8B, the source/drain contact CA4 adjacent to the gate contact CB4 may include a first segment CAC4 having a relatively small width in the first lateral direction (X direction) and a second segment CAN4 having a relatively great width in the first lateral direction (X direction). In an outer sidewall of the source/drain contact CA4, which faces the gate contact CB4, a surface of the first segment CAC4 may be offset from a surface of the second segment CAN4 in the first lateral direction (X direction), and a direction in which the surface of the first segment CAC4 is offset may be a direction away from the gate contact CB4 in the first lateral direction (X direction). Accordingly, a sufficient insulation distance between the source/drain contact CA4 and the gate contact CB4 may be obtained. As a result, an undesired parasitic capacitance between the source/drain contact CA4 and the gate contact CB4 may be reduced, and thus, the reliability of the IC device 400 may be improved.

Hereinafter, methods of manufacturing IC devices, according to embodiments of the inventive concept, will be described with reference to specific examples.

Figure 9:
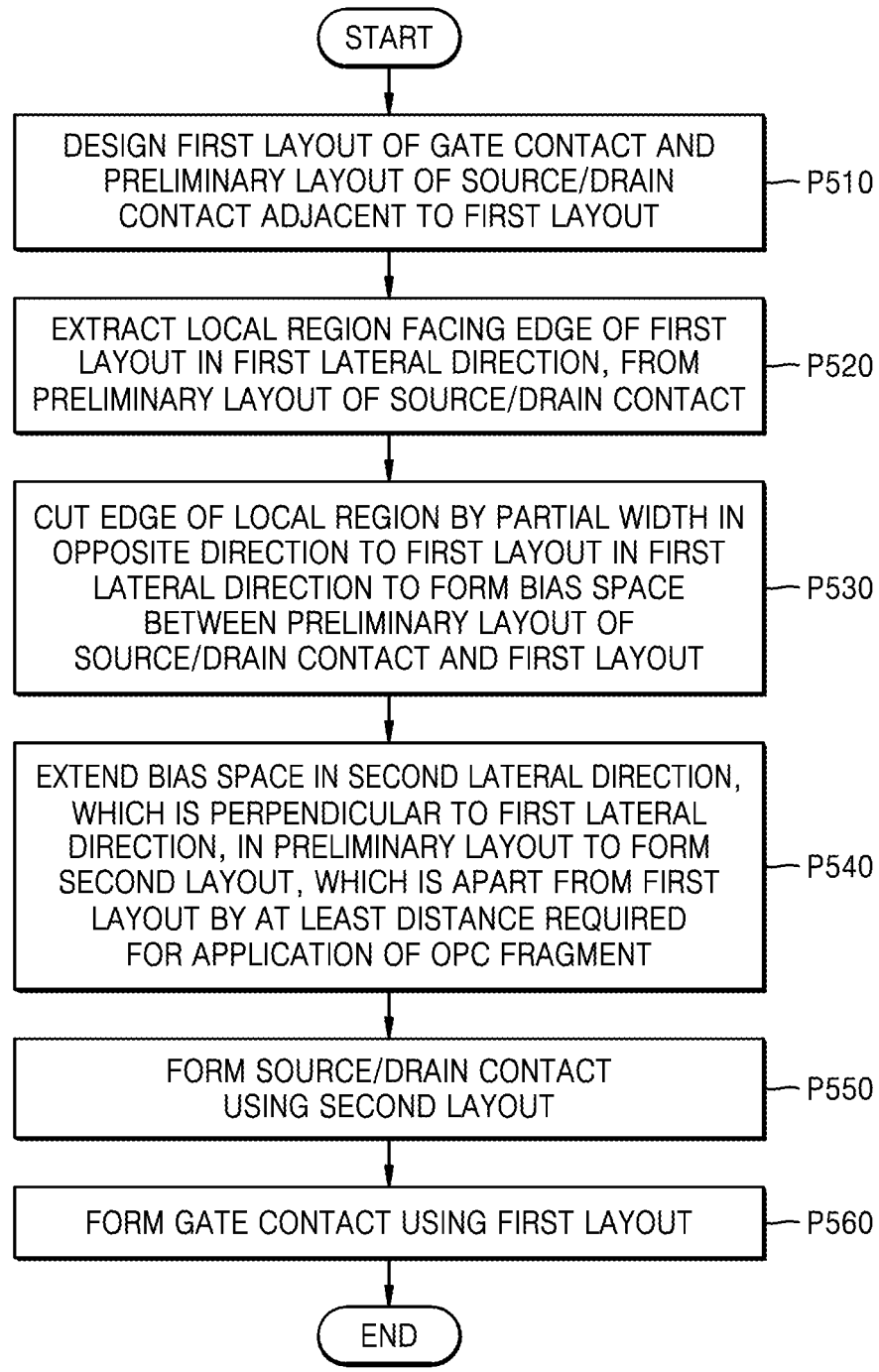
FIG. 9 is a flowchart of a method of manufacturing an IC device, according to embodiments of the inventive concept.
Figure 10A:
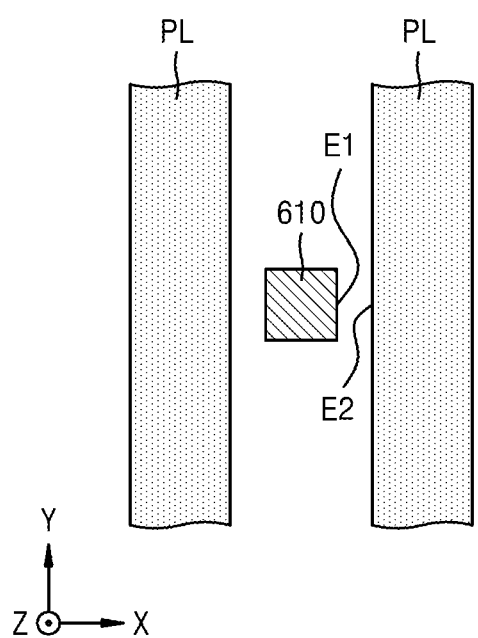
FIGS. 10A to 10C are plan views of a process sequence of some processes of the method of manufacturing the IC device, which is shown in FIG. 9 according to embodiments of the inventive concept.
Figure 10B:
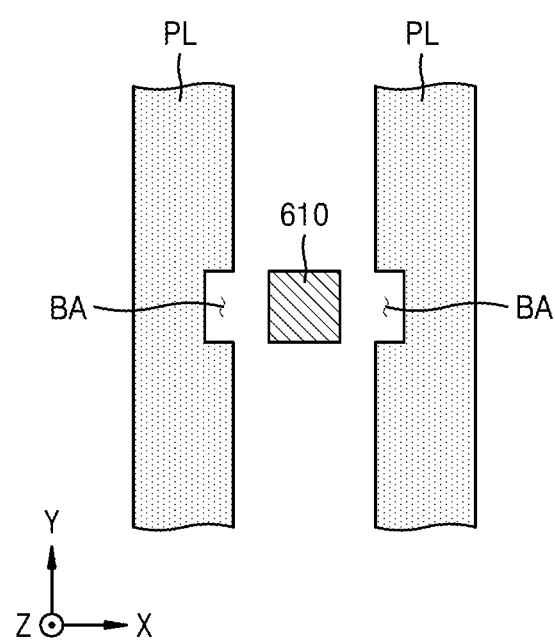
Figure 10C:
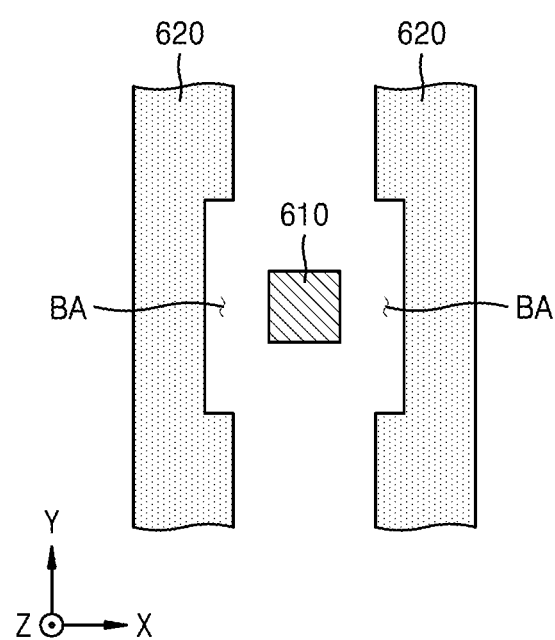

FIG. 9 is a flowchart of a method of manufacturing an IC device, according to embodiments of the inventive concept. FIGS. 10A to 10C are plan views of a process sequence of some processes of the method of manufacturing the IC device, which is shown in FIG. 9.

Referring to FIGS. 9 and 10A, in process P510, a first layout 610 for forming a gate contact and a pair of preliminary layouts PL for forming source/drain contacts may be designed.

The pair of preliminary layouts PL may be adjacent to the first layout 610, and the first layout 610 may be between the pair of preliminary layouts PL. An edge E1 of the first layout 610 may face an edge E1 of the pair of preliminary layouts PL in a first lateral direction (X direction).

Referring to FIGS. 9 and 10B, in process P520, a local region facing the edge E1 of the first layout 610 in the first lateral direction (X direction) may be extracted from the pair of preliminary layouts PL for forming the source/drain contacts. In process P530, the edge E2 of the extracted local region may be cut by a partial width in an opposite direction to the first layout 610 in the first lateral direction (X direction). Thus, a bias space BA may be formed between each of the pair of preliminary layouts PL for forming the source/drain contacts and the first layout 610.

After process P530, a length of the bias space BA may be substantially equal to a length of the first layout 610 in a second lateral direction (Y direction), which is perpendicular to the first lateral direction (X direction).

Referring to FIGS. 9 and 10C, in process P540, the bias space BA may extend in the second lateral direction (Y direction) in the pair of preliminary layouts PL included in the resultant structure of FIG. 10B, and thus, a pair of second layouts 620 may be formed from the pair of preliminary layouts PL.

Each of the pair of second layouts 620 may be apart from the first layout 610 with the bias space BA, which is extended, therebetween in a lateral direction. A distance between the first layout 610 and the second layout 620 may be at least a smallest distance used for the application of an OPC fragment to an OPC model.

Referring to FIG. 9, in process P550, a pair of source/drain contacts may be formed using the pair of second layouts 620 shown in FIG. 10C.

In example embodiments, each of the pair of source/drain contacts formed in process P550 may be one of the plurality of source/drain contacts CA shown in FIG. 2 or one of the plurality of source/drain contacts CA4 shown in FIG. 7.

Referring to FIG. 9, in process P560, a gate contact may be formed using the first layout 610 shown in FIG. 10C.

In example embodiments, the gate contact formed in process P560 may be one of the plurality of gate contacts CB shown in FIG. 2 or one of the plurality of gate contacts CB4 shown in FIG. 7.

Although FIG. 9 illustrates an example in which process P550 for forming the source/drain contacts is followed by process P560 for forming the gate contact, embodiments of the inventive concept are not limited thereto. In other example embodiments, performing process P560 for forming the gate contact may be followed by forming process P550 for forming the source/drain contacts. In yet other example embodiments, process P550 for forming the source/drain contacts may be performed simultaneously or in coordination with process P560 for forming the gate contacts.

Figure 11A:
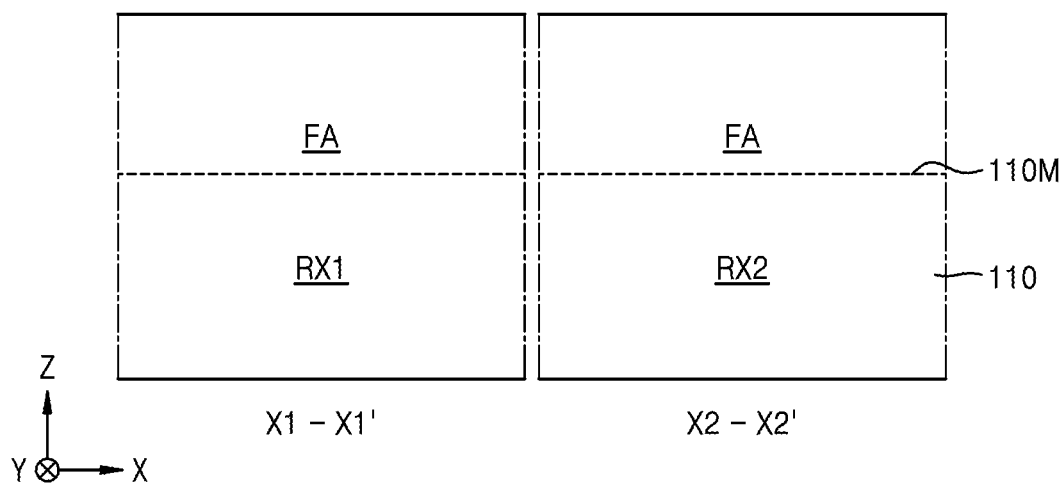
FIGS. 11A to 17C are cross-sectional views of a process sequence of a method of manufacturing an IC device, according to embodiments of the inventive concept, wherein FIGS. 11A, 12A, . . . , and 17A are cross-sectional views of portions corresponding to a cross-section taken along line X1-X1' of FIG. 2 and a cross-section taken along line X2-X2' of FIG. 2, according to a process sequence, FIGS. 11B, 12B, . . . , and 17B are cross-sectional views of a portion corresponding to a cross-section taken along line Y1-Y1' of FIG. 2, according to a process sequence, and FIGS. 11C, 12C, . . . , and 17C are cross-sectional views taken along line Y2-Y2' of FIG. 2, according to a process sequence.

FIGS. 11A to 17C are cross-sectional views of a process sequence of a method of manufacturing an IC device, according to embodiments of the inventive concept. FIGS. 11A, 12A, ..., and 17A are cross-sectional views of portions corresponding to a cross-section taken along line X1-X1' of FIG. 2 and a cross-section taken along line X2-X2' of FIG. 2, according to a process sequence. FIGS. 11B, 12B, ..., and 17B are cross-sectional views of a portion corresponding to a cross-section taken along line Y1-Y1' of FIG. 2, according to a process sequence. FIGS. 11C, 12C, ..., and 17C are cross-sectional views taken along line Y2-Y2' of FIG. 2, according to a process sequence. A method of manufacturing the IC device shown in FIGS. 2 and 3A to 3D, according to an example embodiment, will be described with reference to FIGS. 11A to 17C. In FIGS. 11A to 17C, the same reference numerals are used to denote the same elements as in FIGS. 2 and 3A to 3D, and detailed descriptions thereof are omitted.

Figure 11B:
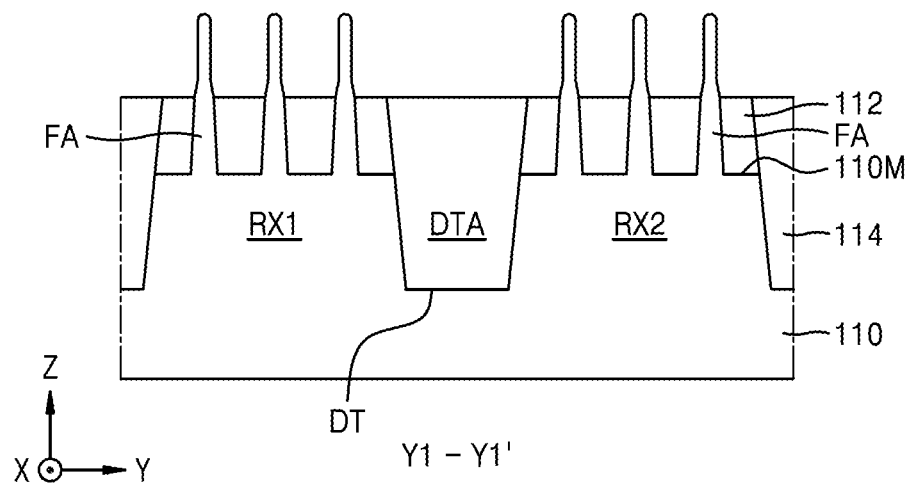
Figure 11C:
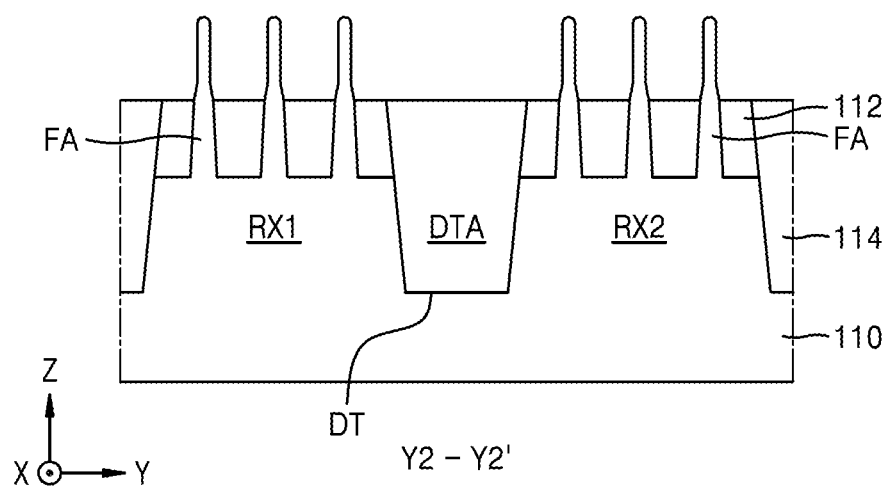

Referring to FIGS. 11A, 11B, and 11C, partial regions of a substrate 110 may be etched in the first device region RX1 and the second device region RX2, and thus, a plurality of fin-type active regions FA and a device isolation film 112 may be formed. The plurality of fin-type active regions FA may protrude over a main surface 110M of the substrate 110 in a vertical direction (Z direction) and extend parallel to each other in the first lateral direction (X direction). The device isolation film 112 may at least partially cover both lower sidewalls of each of the plurality of fin-type active regions FA.

A portion of the device isolation film 112 and a portion of the substrate 110 may be etched to form a deep trench DT defining the first device region RX1 and the second device region RX2. The deep trench DT may be at least partially filled with an inter-device isolation insulating film 114. The plurality of fin-type active regions FA may protrude over a top surface of the device isolation film 112 in the first device region RX1 and the second device region RX2.

Figure 12A:
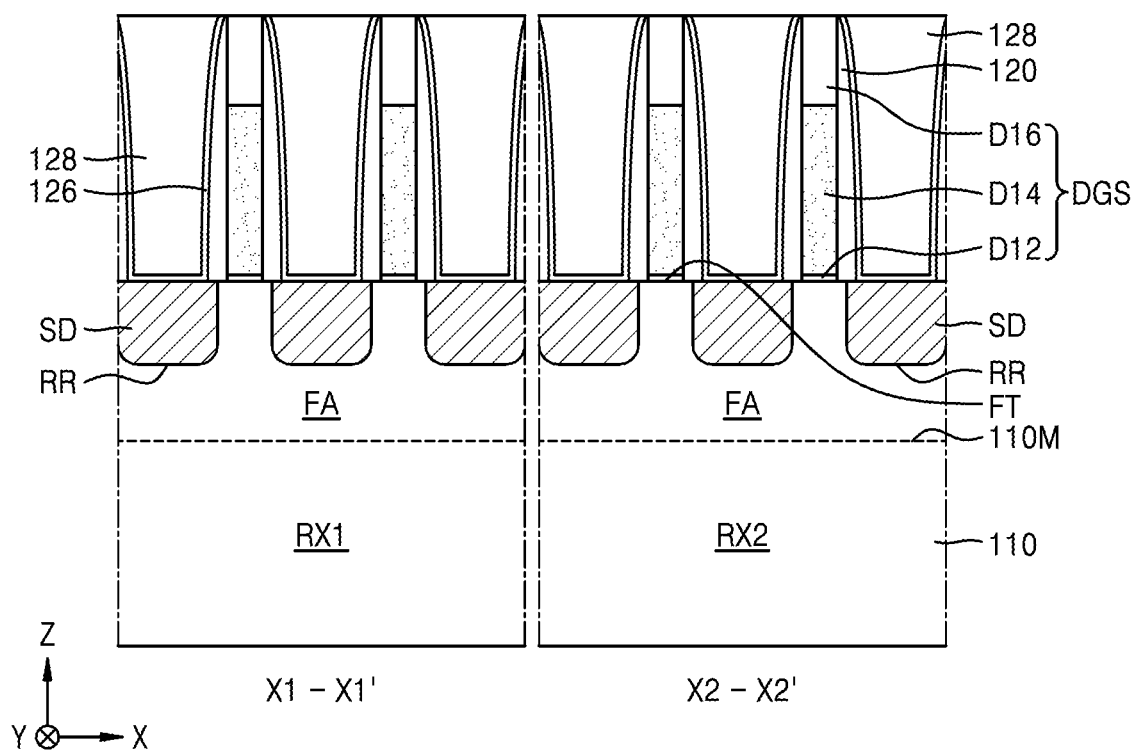
Figure 12B:
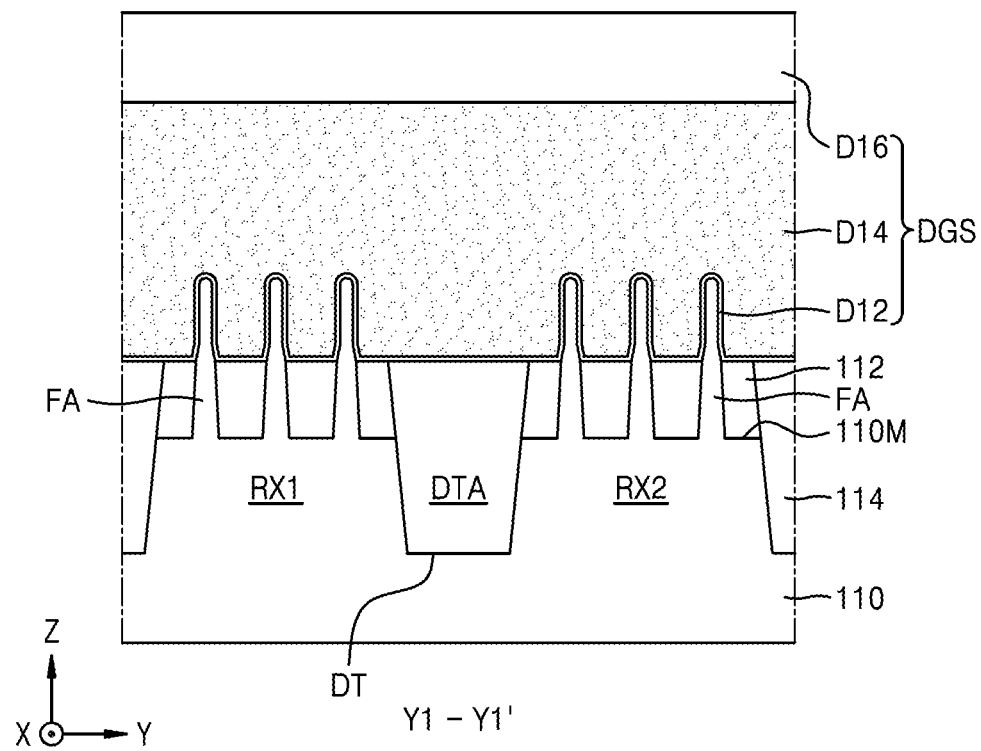
Figure 12C:
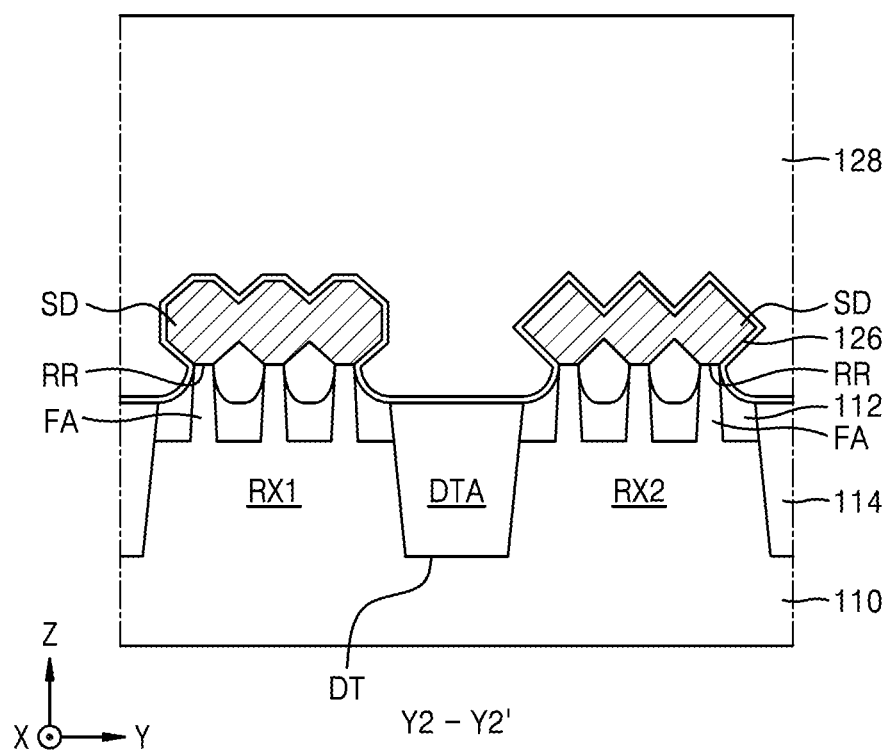

Referring to FIGS. 12A, 12B, and 12C, a plurality of dummy gate structures DGS may be formed on the device isolation film 112 and the inter-device isolation insulating film 114 and extend to intersect with the plurality of fin-type active regions FA.

Each of the plurality of dummy gate structures DGS may include a dummy gate insulating film D12, a dummy gate line D14, and a dummy insulating capping layer D16, which are sequentially stacked on each of the plurality of fin-type active regions FA. The dummy gate insulating film D12 may include silicon oxide. The dummy gate line D14 may include polysilicon. The dummy insulating capping layer D16 may include silicon nitride.

Insulating spacers 120 may be formed on both sides of the dummy gate structure DGS, and portions of the plurality of fin-type active regions FA, which are exposed on both sides of the dummy gate structure DGS, may be exposed to form a recess region RR on a top surface of each of the plurality of fin-type active regions FA. Afterwards, a plurality of source/drain regions SD may be formed to at least partially fill a plurality of recess regions RR.

The device isolation film 112, the inter-device isolation insulating film 114, and the plurality of source/drain regions SD may be conformally at least partially covered by an insulating liner 126 between the plurality of dummy gate structures DGS, and an inter-gate dielectric film 128 may be formed on the insulating liner 126.

Figure 13A:
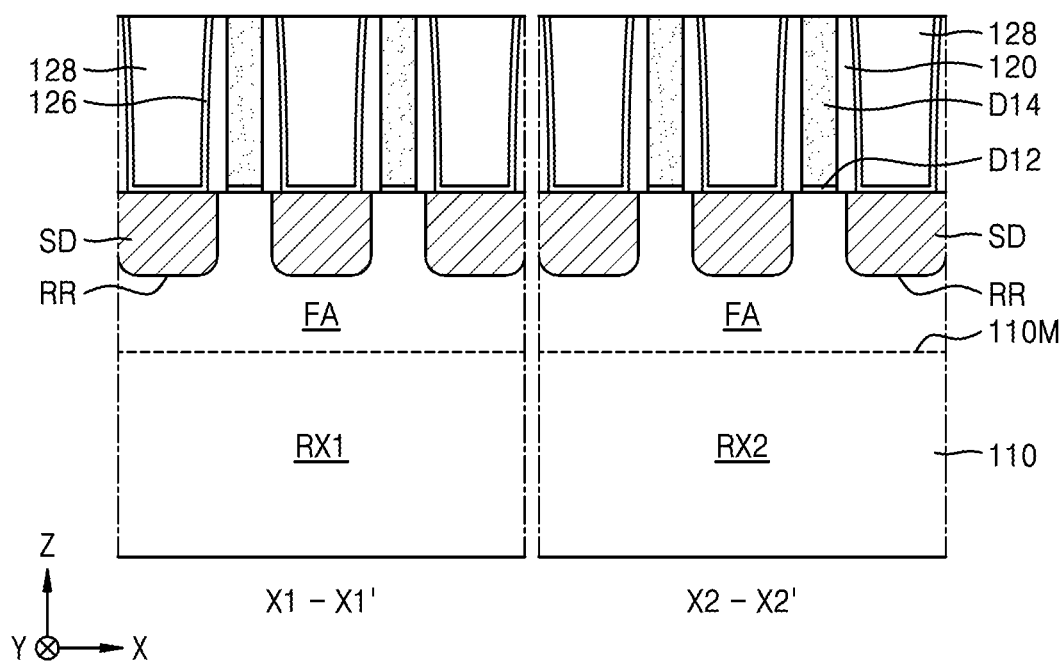
Figure 13B:
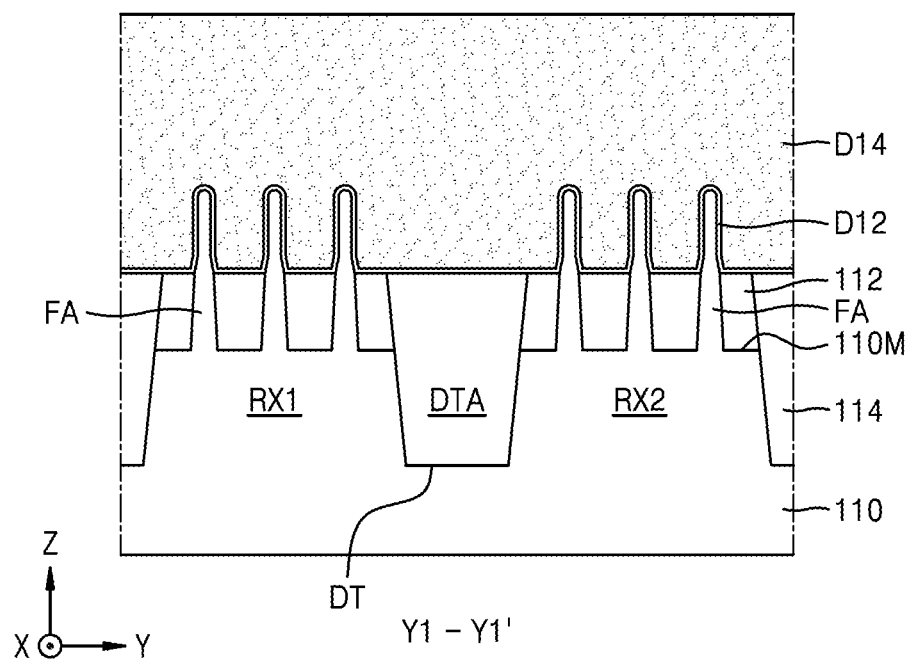
Figure 13C:
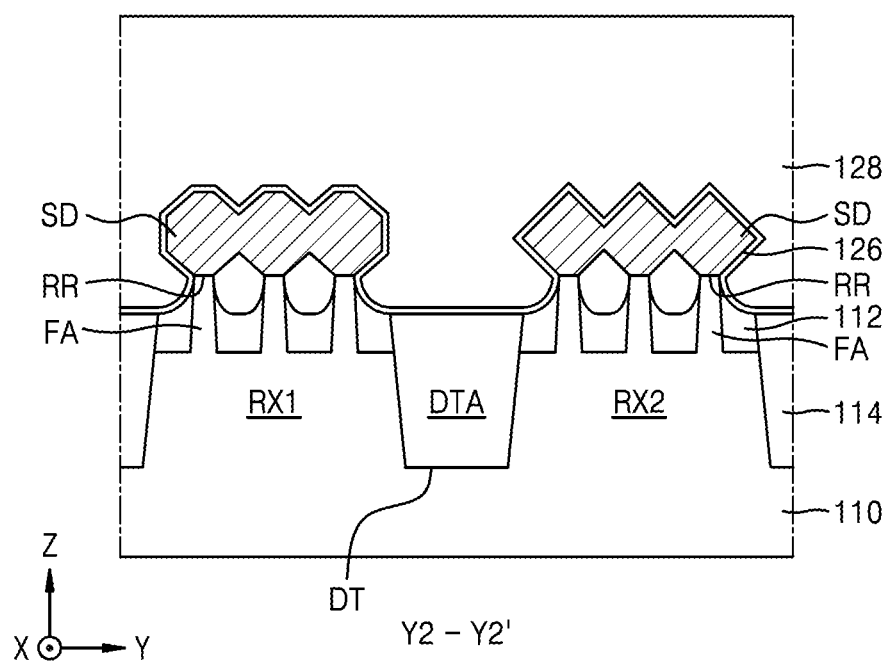

Referring to FIGS. 13A, 13B, and 13C, the dummy insulating capping layer D16 and insulating films adjacent thereto may be removed using a chemical mechanical polishing (CMP) process from the resultant structure of FIGS. 12A, 12B, and 12C to expose the dummy gate line D14. In this operation, heights of the plurality of insulating spacers 120, the insulating liner 126, and the inter-gate dielectric film 128 may be reduced.

Figure 14A:
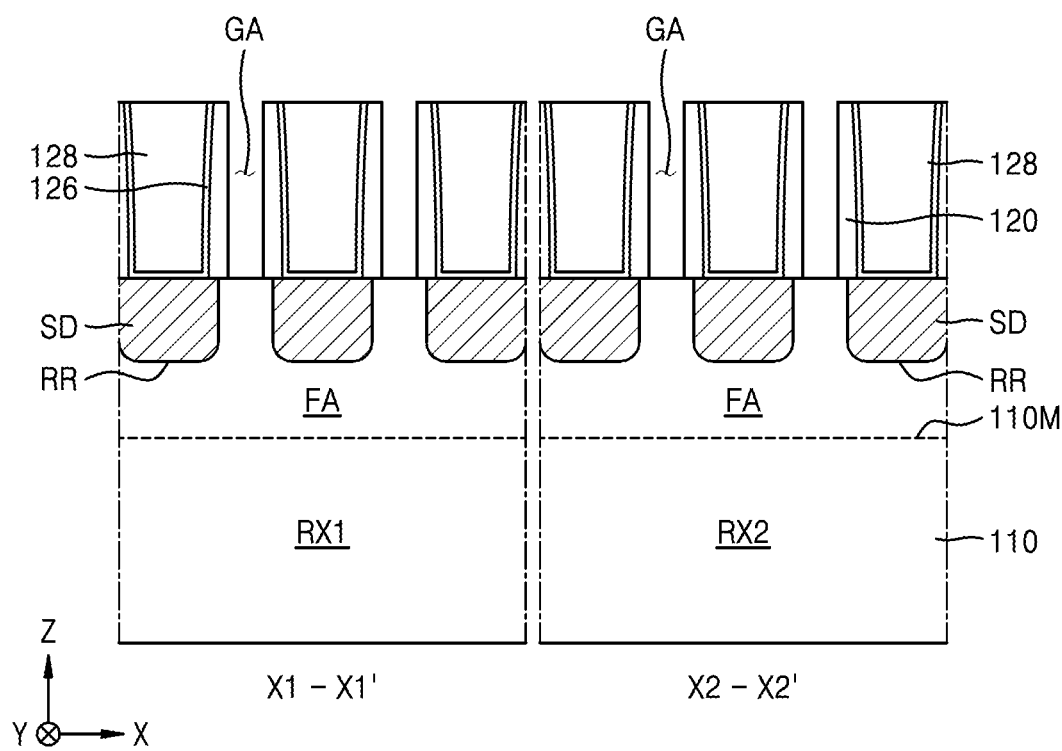
Figure 14B:
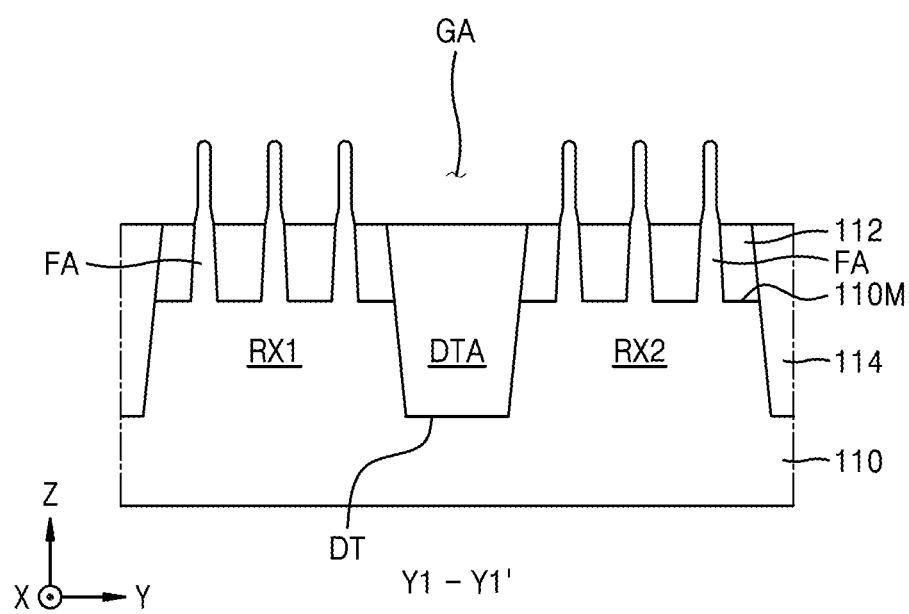
Figure 14C:
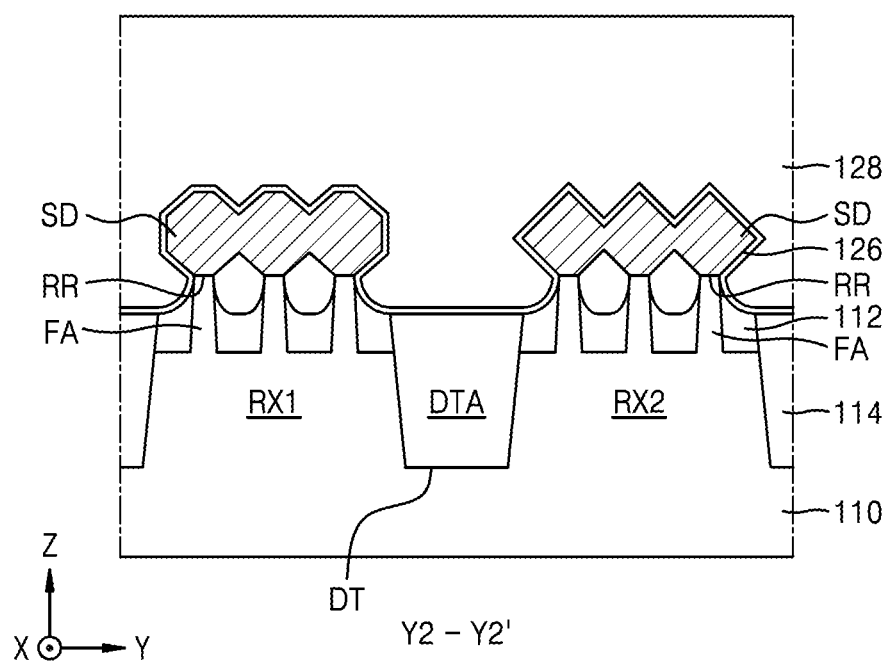

Referring to FIGS. 14A, 14B, and 14C, a plurality of dummy gate lines D14 and a plurality of dummy gate insulating films D12 may be removed from the resultant structure of FIGS. 13A, 13B, and 13C to provide a plurality of gate spaces GA. The insulating spacer 120, the plurality of fin-type active regions FA, the device isolation film 112, and the inter-device isolation insulating film 114 may be exposed through the plurality of gate spaces GA.

Figure 15A:
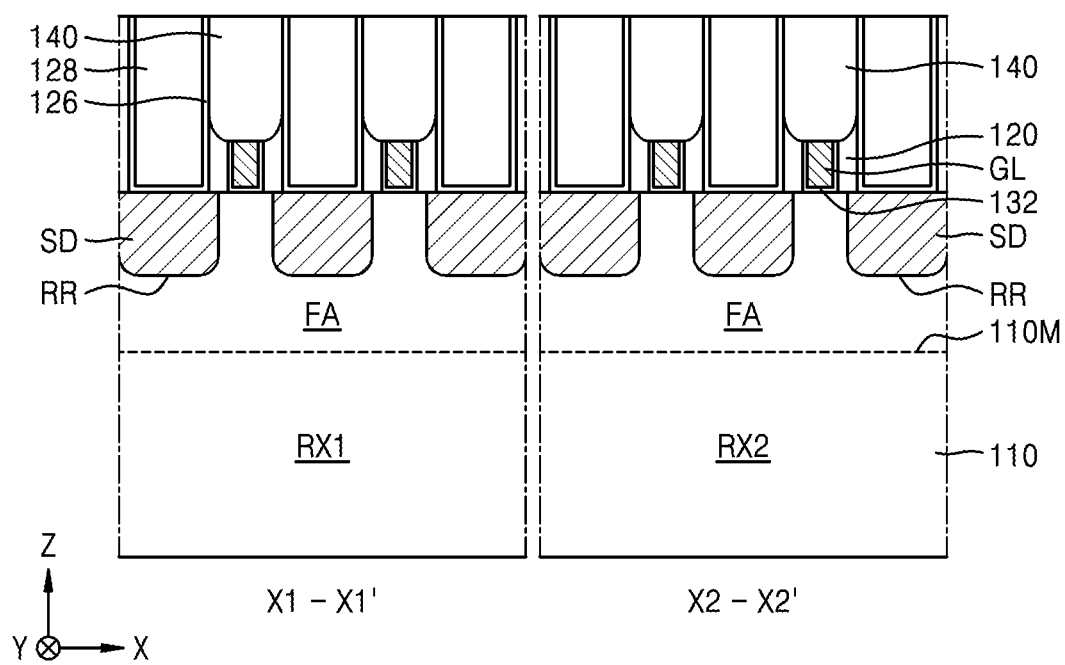
Figure 15B:
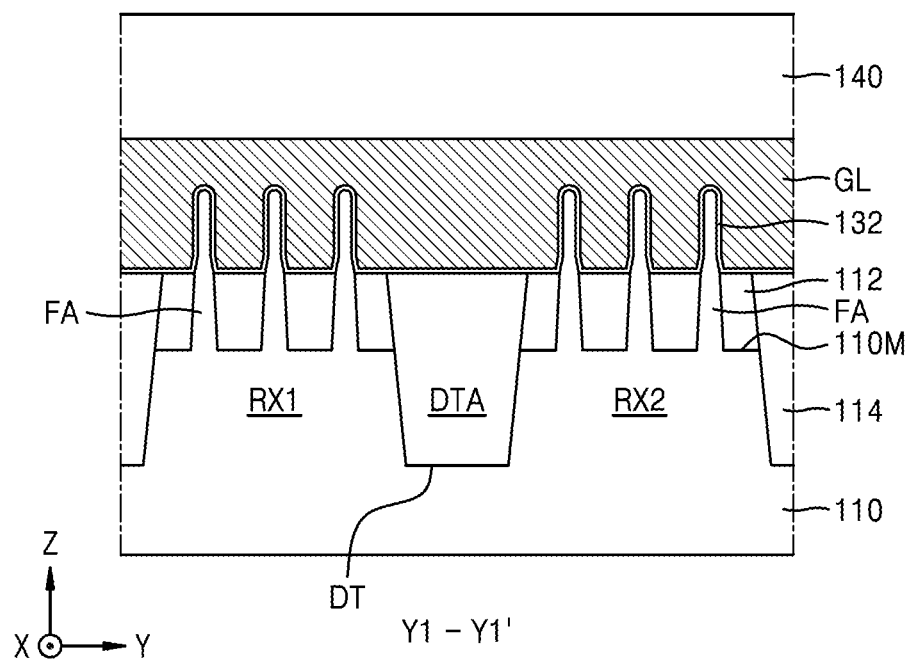
Figure 15C:
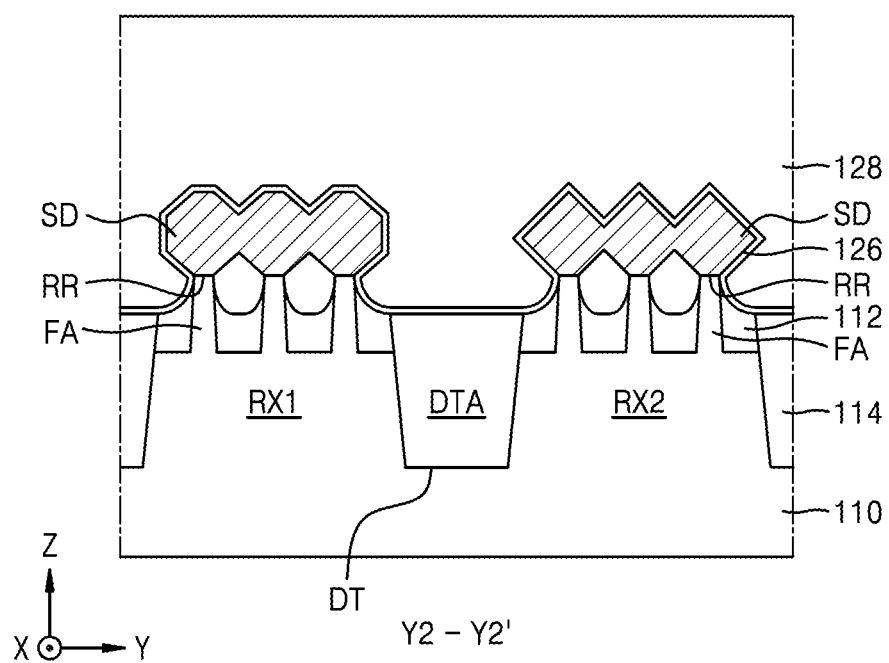

Referring to FIGS. 15A, 15B, and 15C, a gate insulating film 132, a gate line GL, and an insulating capping line 140 may be formed inside the plurality of gate spaces GA in the resultant structure of FIGS. 14A, 14B, and 14C.

The formation of the gate insulating film 132, the gate line GL, and the insulating capping line 140 may include at least partially filling the plurality of gate spaces GA with a plurality of gate insulating films 132 and a plurality of gate lines GL and etching back the plurality of gate insulating films 132, the plurality of gate lines GL, and the plurality of insulating spacers 120 to reduce heights thereof. Afterwards, the insulating capping line 140 may be formed inside each of the plurality of gate spaces GA to at least partially cover a top surface of the gate line GL, the gate insulating film 132, and the insulating spacer 120 and at least partially fill an upper portion of the gate spaces GA.

In example embodiments, before the gate insulating film 132 is formed, an interface film (not shown) may be formed to at least partially cover a surface of each of the plurality of fin-type active regions exposed through the plurality of gate spaces GA. To form the interface film, portions of the plurality of fin-type active regions FA, which are exposed in the plurality of gate spaces GA, may be oxidized.

Figure 16A:
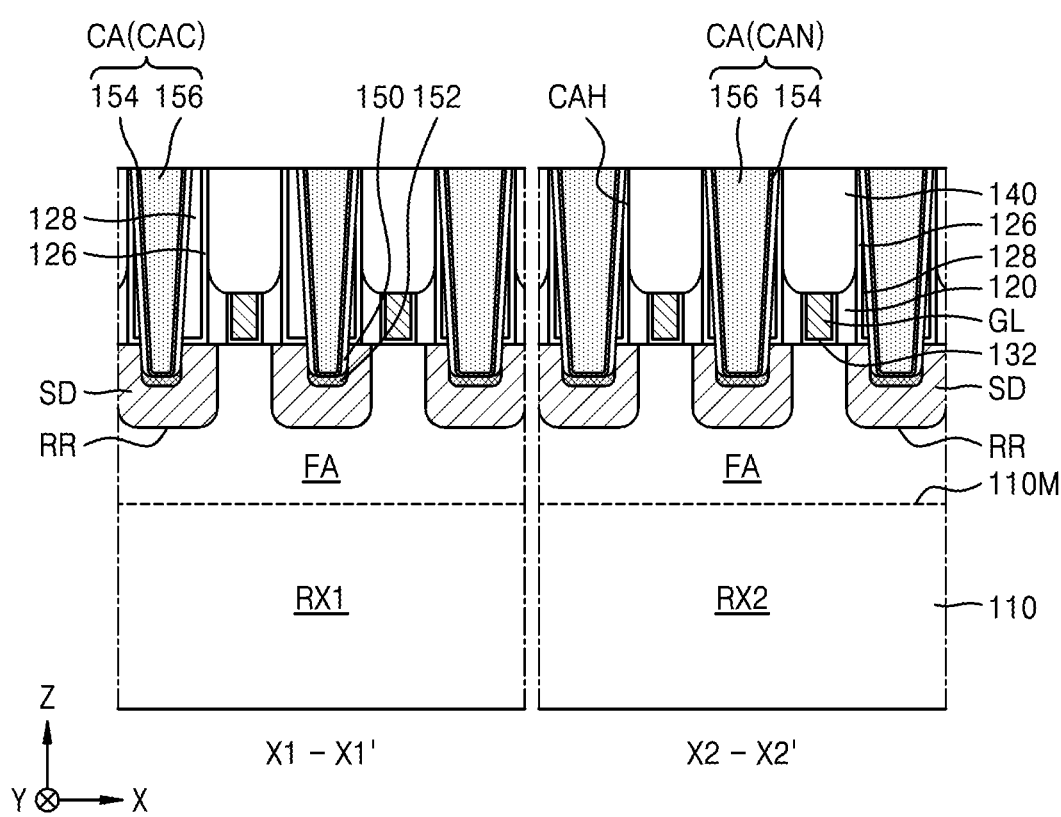
Figure 16B:
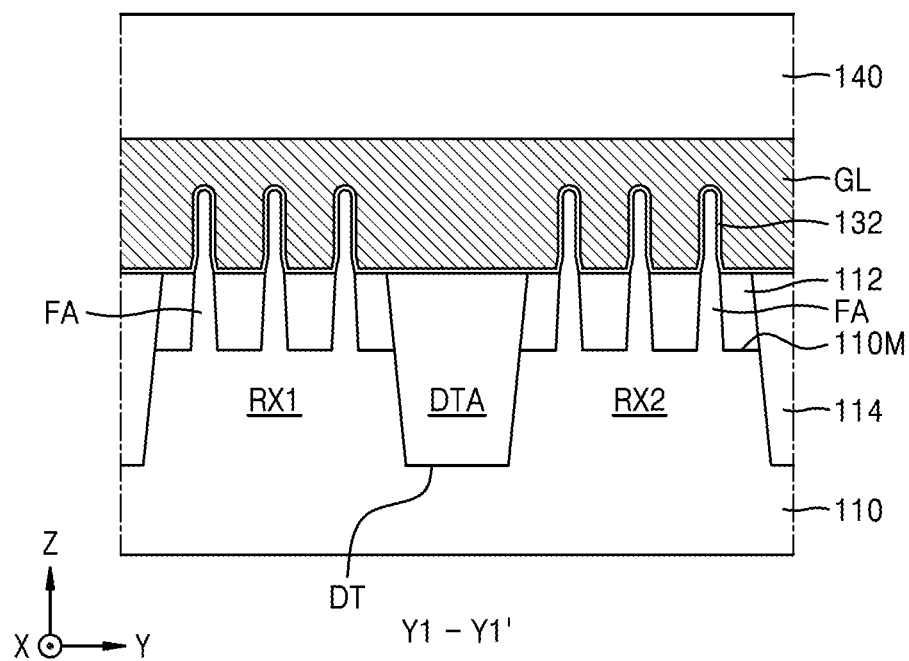
Figure 16C:
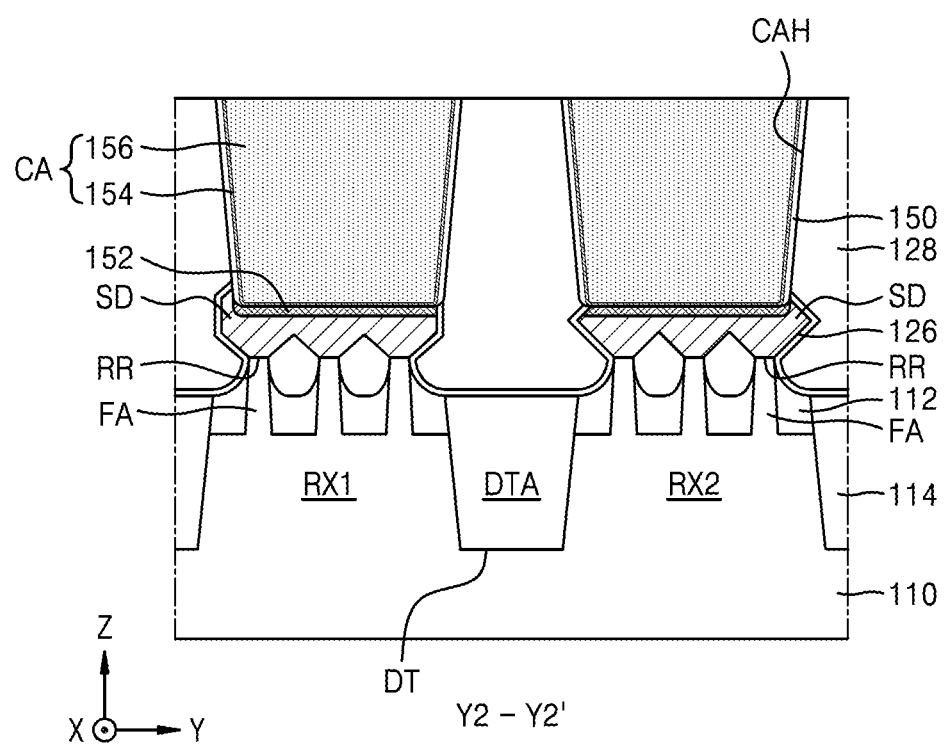

Referring to FIGS. 16A, 16B, and 16C, a plurality of source/drain contact holes CAH may be formed to pass through the inter-gate dielectric film 128 and expose the plurality of source/drain regions SD. Thereafter, inner sidewalls of each of the plurality of source/drain contact holes CAH may be at least partially covered by contact insulating spacers 150. The formation of the contact insulating spacers 150 may include forming an insulating spacer film to conformally at least partially cover inner walls of the plurality of source/drain contact holes CAH and anisotropically etching the insulating spacer film such that the plurality of source/drain regions SD are exposed through the plurality of source/drain contact holes CAH. As a result, a plurality of contact insulating spacers 150, which include the insulating spacer film remaining on sidewalls of the plurality of source/drain contact holes CAH, may be obtained.

A plurality of metal silicide films 152 may be formed under the plurality of source/drain contact holes CAH to at least partially cover the plurality of source/drain regions SD. A plurality of source/drain contacts CA may be formed to at least partially fill the plurality of source/drain contact holes CAH. Each of the plurality of source/drain contacts CA may be formed to include a conductive barrier film 154 and a metal plug 156. As described above with reference to FIGS. 2 and 3A to 3D, at least some of the plurality of source/drain contacts CA may include a first segment CAC and a second segment CAN, which have different widths in the first lateral direction (X direction) and are integrally or monolithically connected to each other.

Figure 17A:
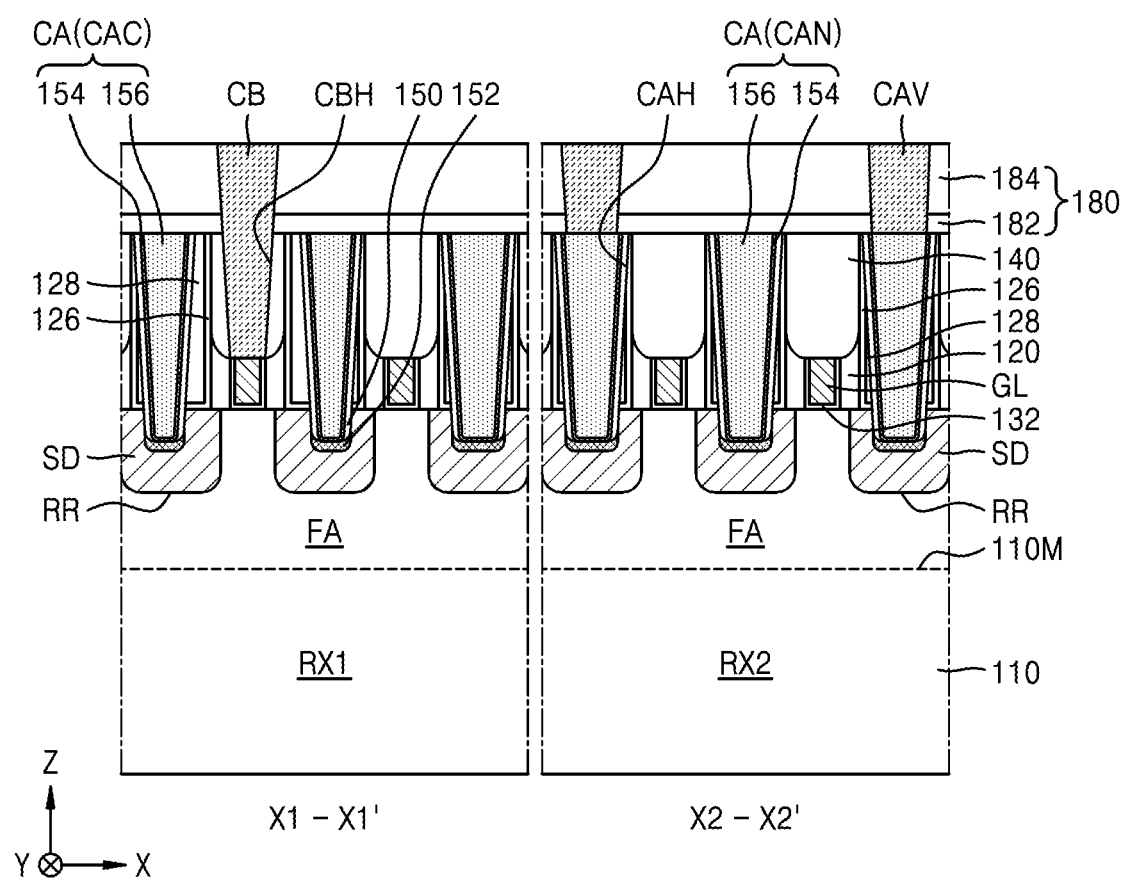
Figure 17B:
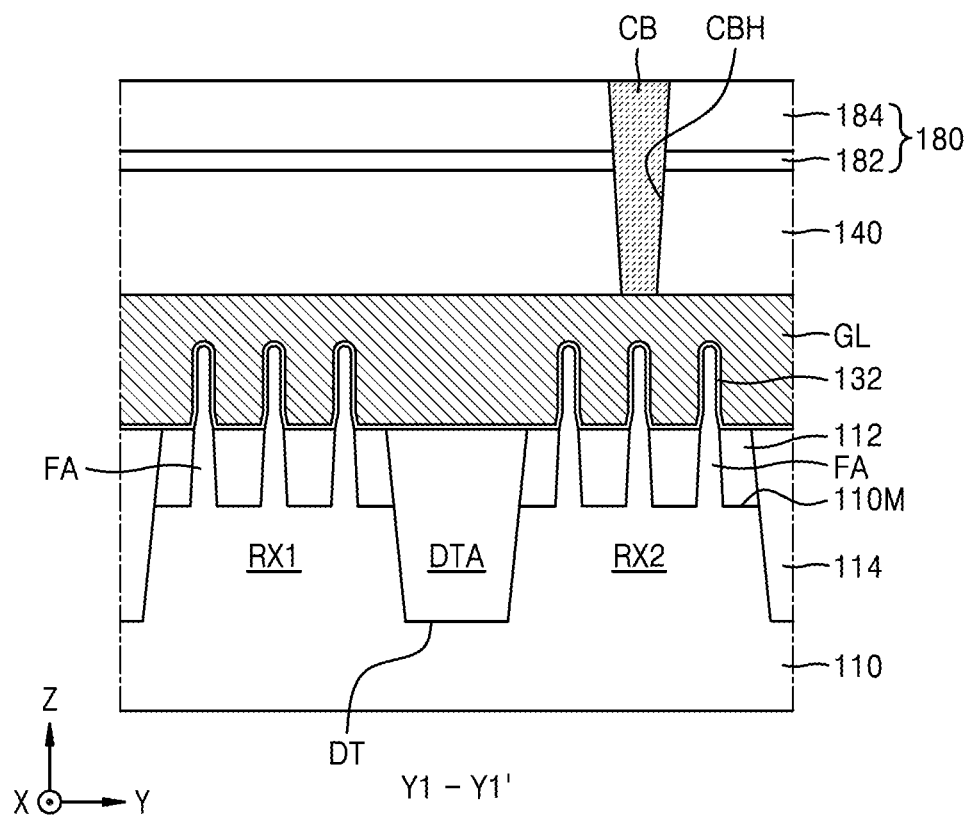
Figure 17C:
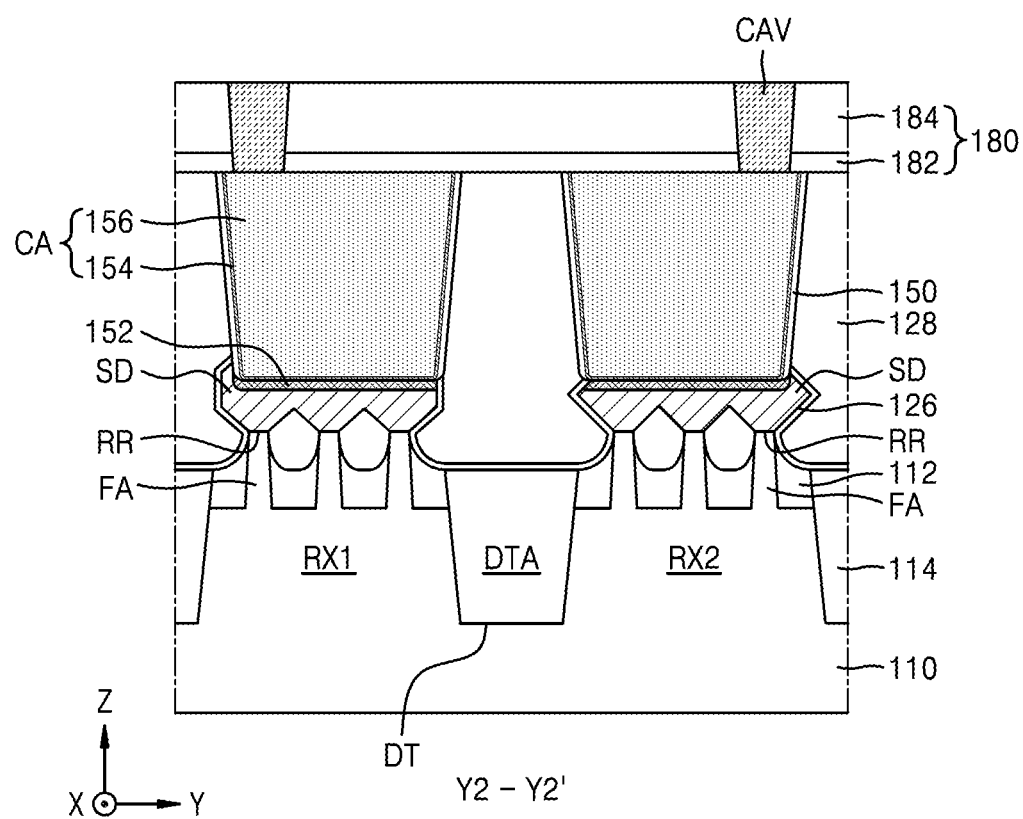

Referring to FIGS. 17A, 17B, and 17C, an insulating structure 180 may be formed by forming an etch stop film 182 and an interlayer insulating film 184 to sequentially at least partially cover a top surface of the resultant structure of FIGS. 16A, 16B, and 16C. Thereafter, a plurality of source/drain via contacts CAV may be formed to be connected to the plurality of source/drain contacts CA. A plurality of gate contacts CB may be formed to be connected to the plurality of gate lines GL.

In example embodiments, the plurality of source/drain via contacts CAV may be formed simultaneously or in coordination with the plurality of gate contacts CB. In other example embodiments, the plurality of source/drain via contacts CAV and the plurality of gate contacts CB may be sequentially formed using separate processes. In these example embodiments, forming the plurality of source/drain via contacts CAV may be followed by forming the plurality of gate contacts CB. In other embodiments, forming the plurality of gate contacts CB may be followed by forming the plurality of source/drain via contacts CAV.

In example embodiments, the process of forming the plurality of source/drain contacts CA, which has been described above with reference to FIGS. 16A, 16B, and 16C, and the process of forming the plurality of gate contacts CB, which has been described with reference to FIGS. 17A, 17B, and 17C, may be performed using the method described with reference to FIGS. 9 and 10A to 10C.

Although the method of manufacturing the IC device 100 shown in FIGS. 2 and 3A to 3D has been described with reference to FIGS. 11A to 17C, it will be understood that the IC device 200 shown in FIGS. 4 to 6 and various other IC devices having similar structures thereto may be manufactured by making various modifications and changes with reference to FIGS. 11A to 17C within the scope of embodiments of the inventive concept.

Figure 18A:
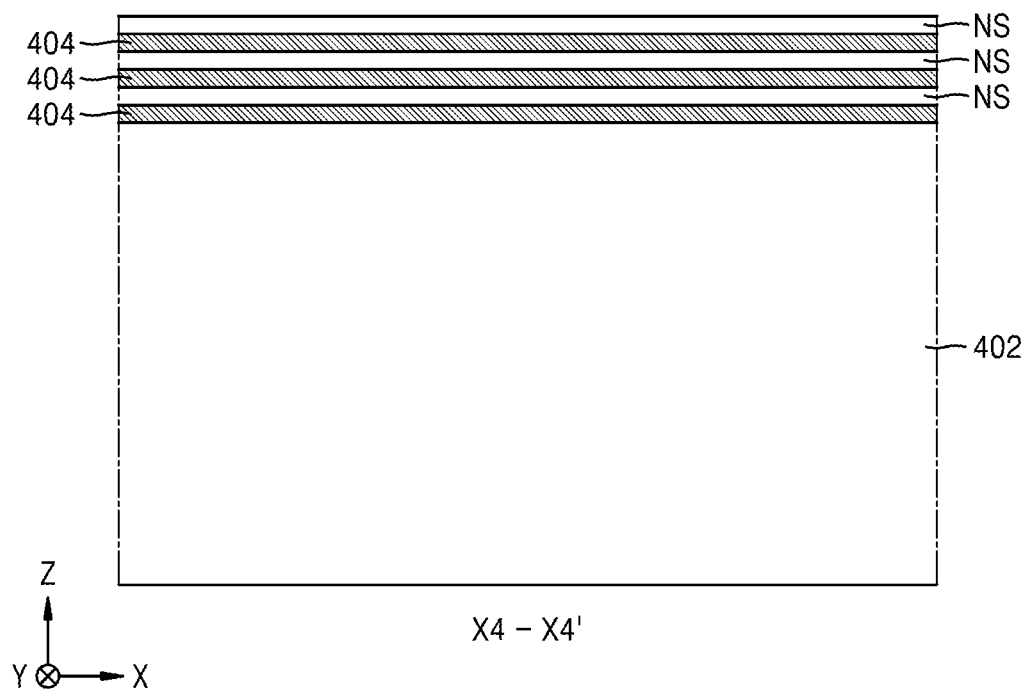
FIGS. 18A to 24 are cross-sectional views of a process sequence of a method of manufacturing an IC device, according to embodiments of the inventive concept, wherein FIGS. 18A, 19A, . . . , 23A, and 24 are cross-sectional views of a portion corresponding to a cross-section taken along a line X4-X4' of FIG. 7, according to a process sequence, and FIGS. 18B, 19B, . . . , and 23B are cross-sectional views of a portion corresponding to a cross-section taken along a line Y4-Y4' of FIG. 7, according to a process sequence.

FIGS. 18A to 24 are cross-sectional views of a process sequence of a method of manufacturing an IC device, according to embodiments of the inventive concept. FIGS. 18A, 19A, . . . , 23A, and 24 are cross-sectional views of a portion corresponding to a cross-section taken along a line X4-X4' of FIG. 7, according to a process sequence. FIGS. 18B, 19B, . . . , and 23B are cross-sectional views of a portion corresponding to a cross-section taken along a line Y4-Y4' of FIG. 7, according to a process sequence. A method of manufacturing the IC device shown in FIGS. 7, 8A, and 8B, according to an example embodiment, will be described with reference to FIGS. 18A to 24. In FIGS. 18A to 24, the same reference numerals are used to denote the same elements as in FIGS. 7, 8A, and 8B, and detailed descriptions thereof are omitted.

Figure 18B:
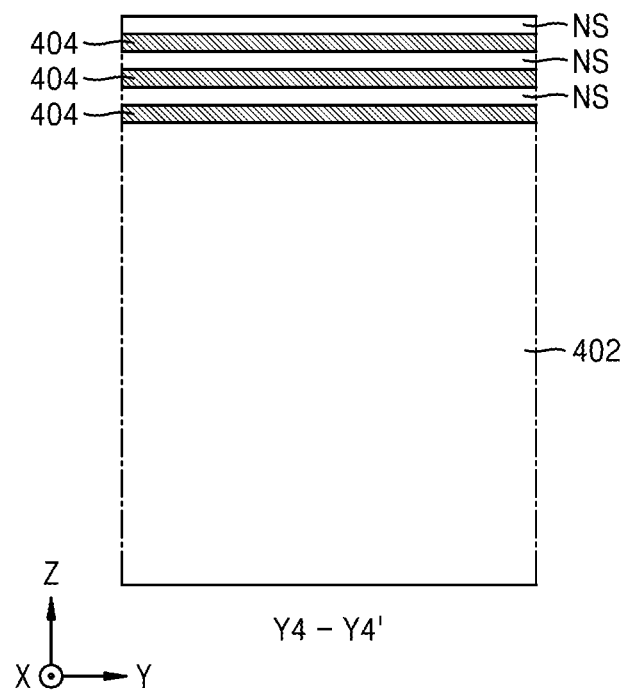

Referring to FIGS. 18A and 18B, a plurality of sacrificial semiconductor layers 404 and a plurality of nanosheet semiconductor layers NS may be alternately stacked one by one on a substrate 402. The plurality of sacrificial semiconductor layers 404 may include a different semiconductor material from the plurality of nanosheet semiconductor layers NS. In example embodiments, the plurality of sacrificial semiconductor layers 404 may include SiGe, and the plurality of nanosheet semiconductor layers NS may include Si.

Figure 19A:
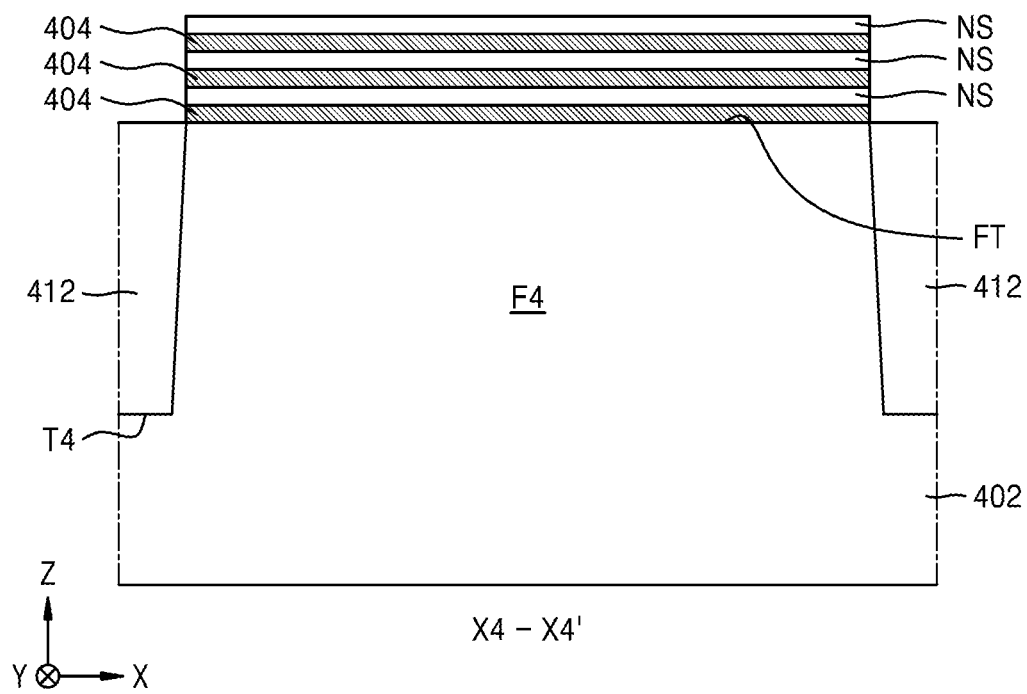
Figure 19B:
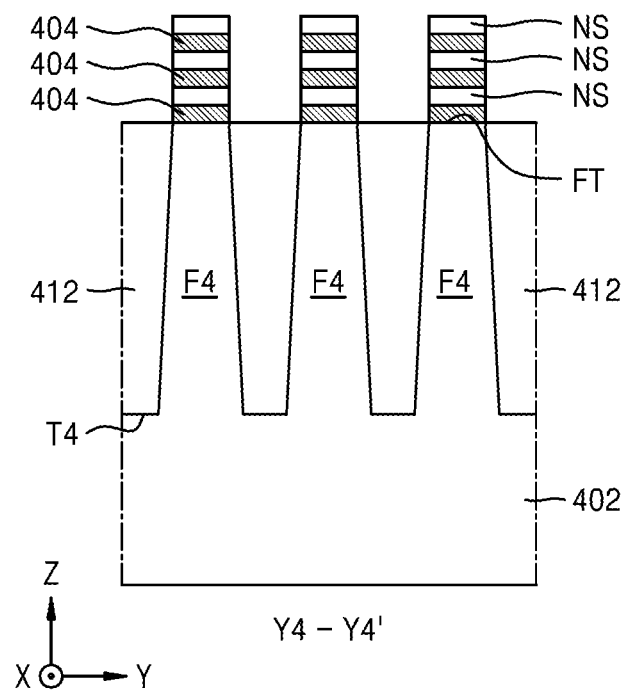

Referring to FIGS. 19A and 19B, a trench T4 may be formed by etching portions of the plurality of sacrificial semiconductor layers 404, the plurality of nanosheet semiconductor layers NS, and the substrate 402, and a device isolation film 412 may be formed inside the trench T4. As a result, a fin-type active region F4 may be defined by the trench T4. A stack structure of the plurality of sacrificial semiconductor layers 404 and the plurality of nanosheet semiconductor layers NS may remain on a top surface of the fin-type active region F4.

Figure 20A:
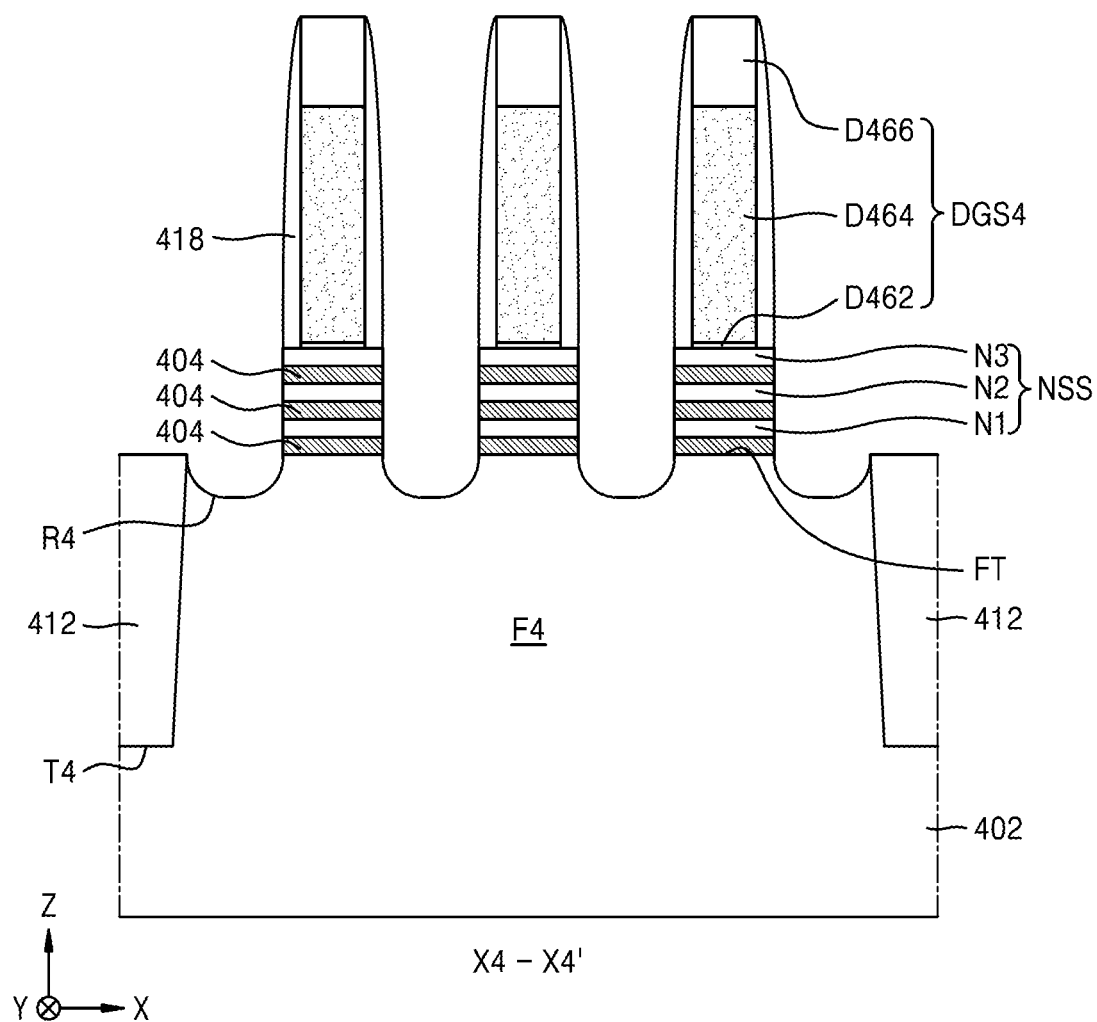
Figure 20B:
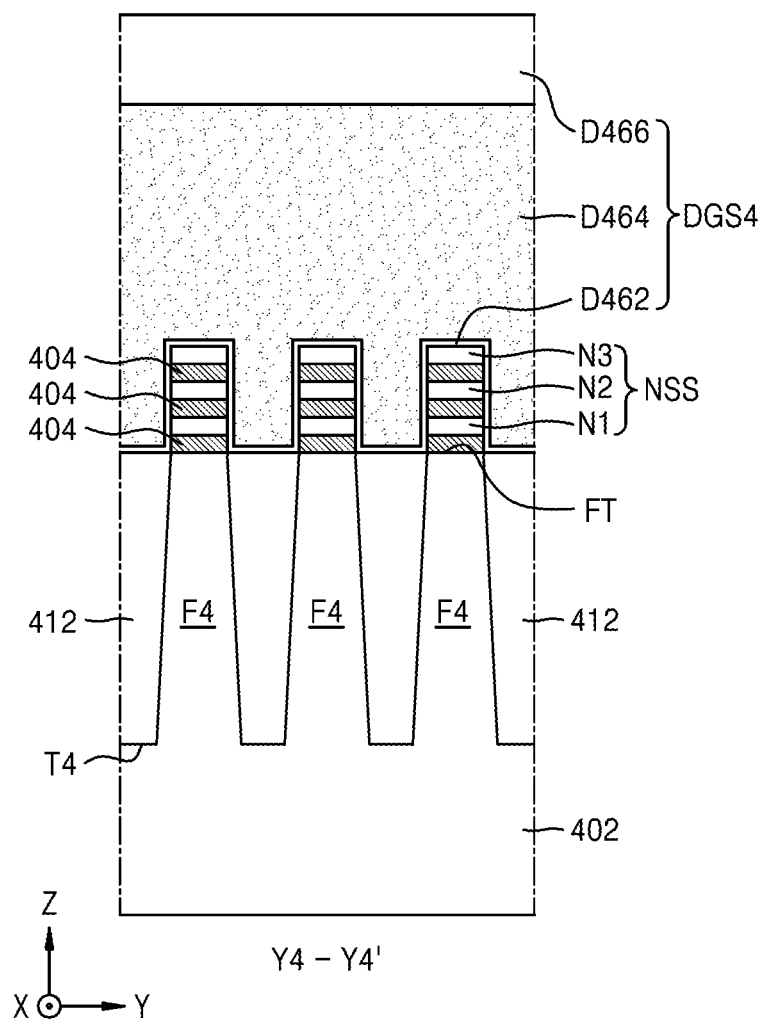

Referring to FIGS. 20A and 20B, in the resultant structure of FIGS. 19A and 19B, a plurality of dummy gate structures DGS4 may be formed on the stack structure of the plurality of sacrificial semiconductor layers 404 and the plurality of nanosheet semiconductor layers NS, and a plurality of outer insulating spacers 418 may be formed to at least partially cover both sidewalls of each of the plurality of dummy gate structures DGS4. Afterwards, portions of the plurality of sacrificial semiconductor layers 404 and the plurality of nanosheet semiconductor layers NS may be respectively etched using the plurality of dummy gate structures DGS4 and the plurality of outer insulating spacers 418 as etch masks, and thus, the plurality of nanosheet semiconductor layers NS may be divided into a plurality of nanosheet stacks including a plurality of nanosheets (e.g., N1, N2, and N3). Thereafter, the fin-type active region F4 exposed between the plurality of nanosheet stacks NSS may be etched, and thus, a plurality of recess regions R4 may be formed in an upper portion of the fin-type active region F4.

Each of the plurality of dummy gate structures DGS4 may extend lengthwise in a second lateral direction (Y direction). Each of the plurality of dummy gate structures DGS4 may have a structure in which an insulating layer D462, a dummy gate layer D464, and a capping layer D466 are sequentially stacked. In example embodiments, the insulating layer D462 may include silicon oxide, the dummy gate layer D464 may include polysilicon, and the capping layer D466 may include silicon nitride.

Figure 21A:
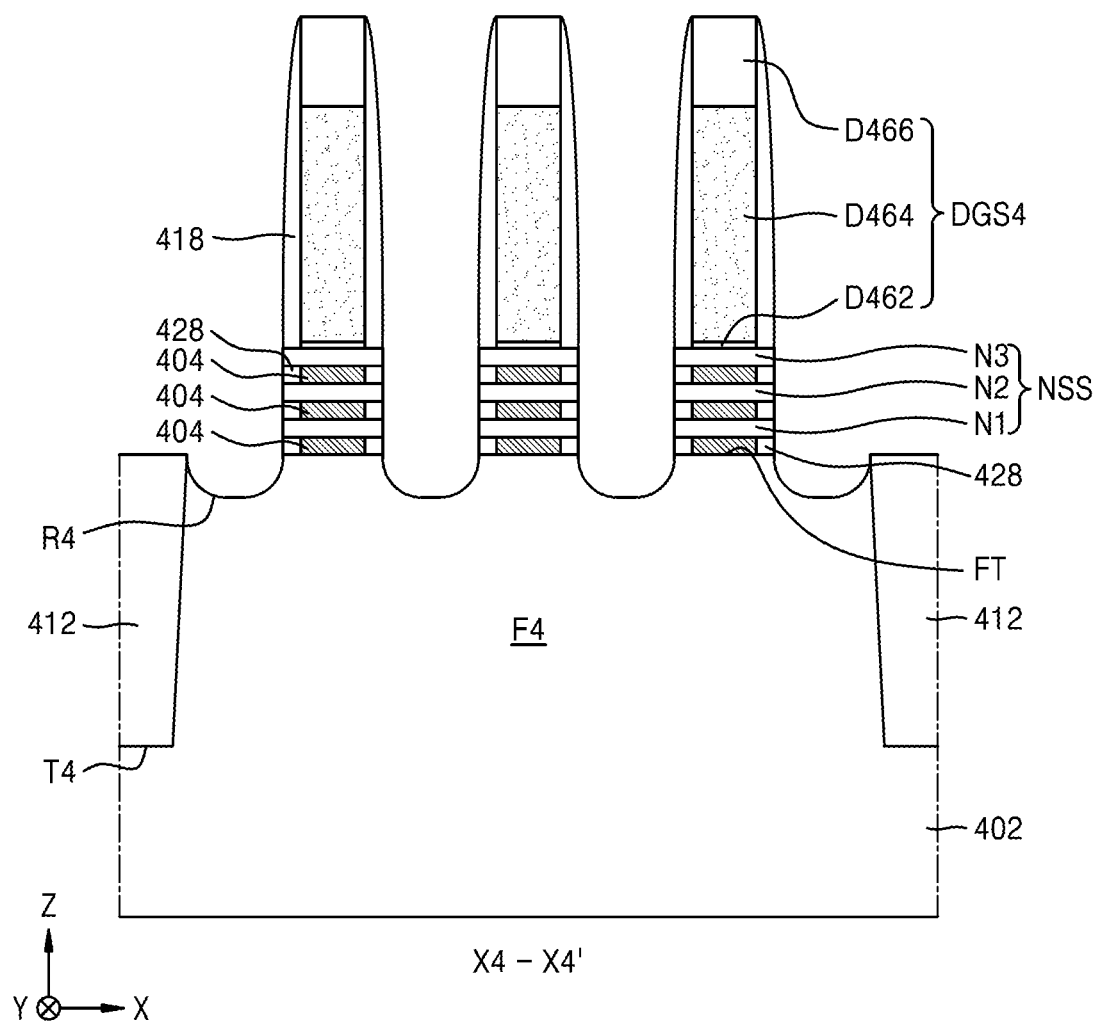
Figure 21B:
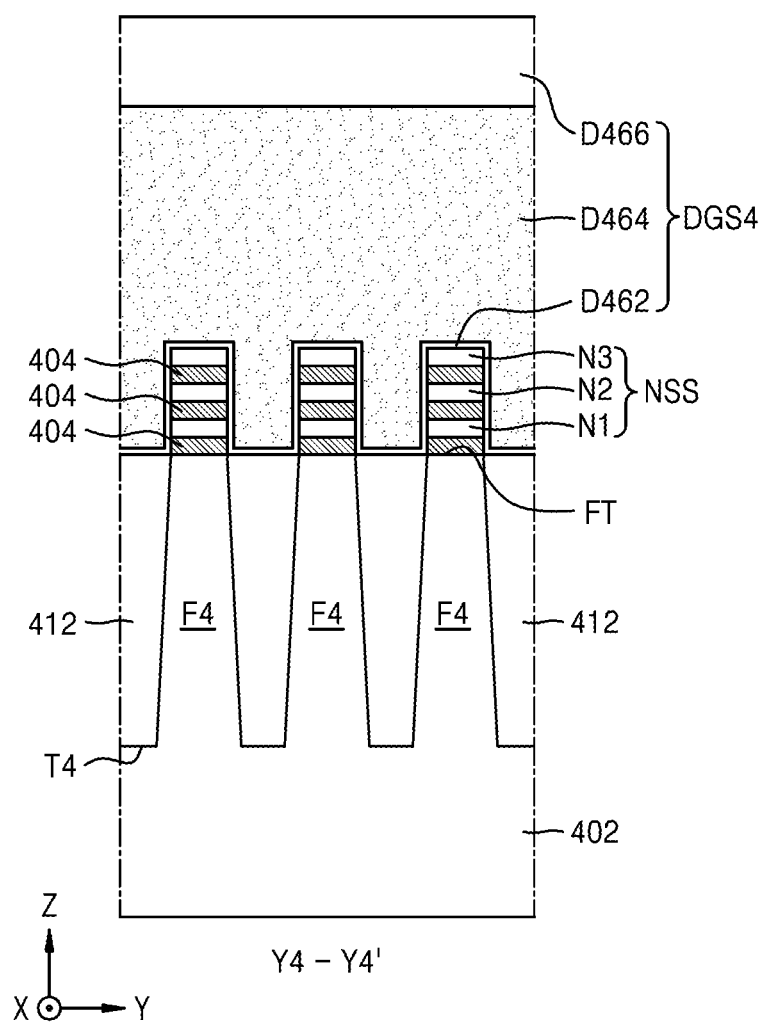

Referring to FIGS. 21A and 21B, respective portions of the plurality of sacrificial semiconductor layers 404 exposed around the plurality of recess regions R4 may be removed from the resultant structure of FIGS. 20A and 20B, and thus, a plurality of indent regions may be formed between the first to third nanosheets N1, N2, and N3 and between the first nanosheet N1 and the top surface FT. Thereafter, a plurality of inner insulating spacers 428 may be formed to at least partially fill the plurality of indent regions.

Figure 22A:
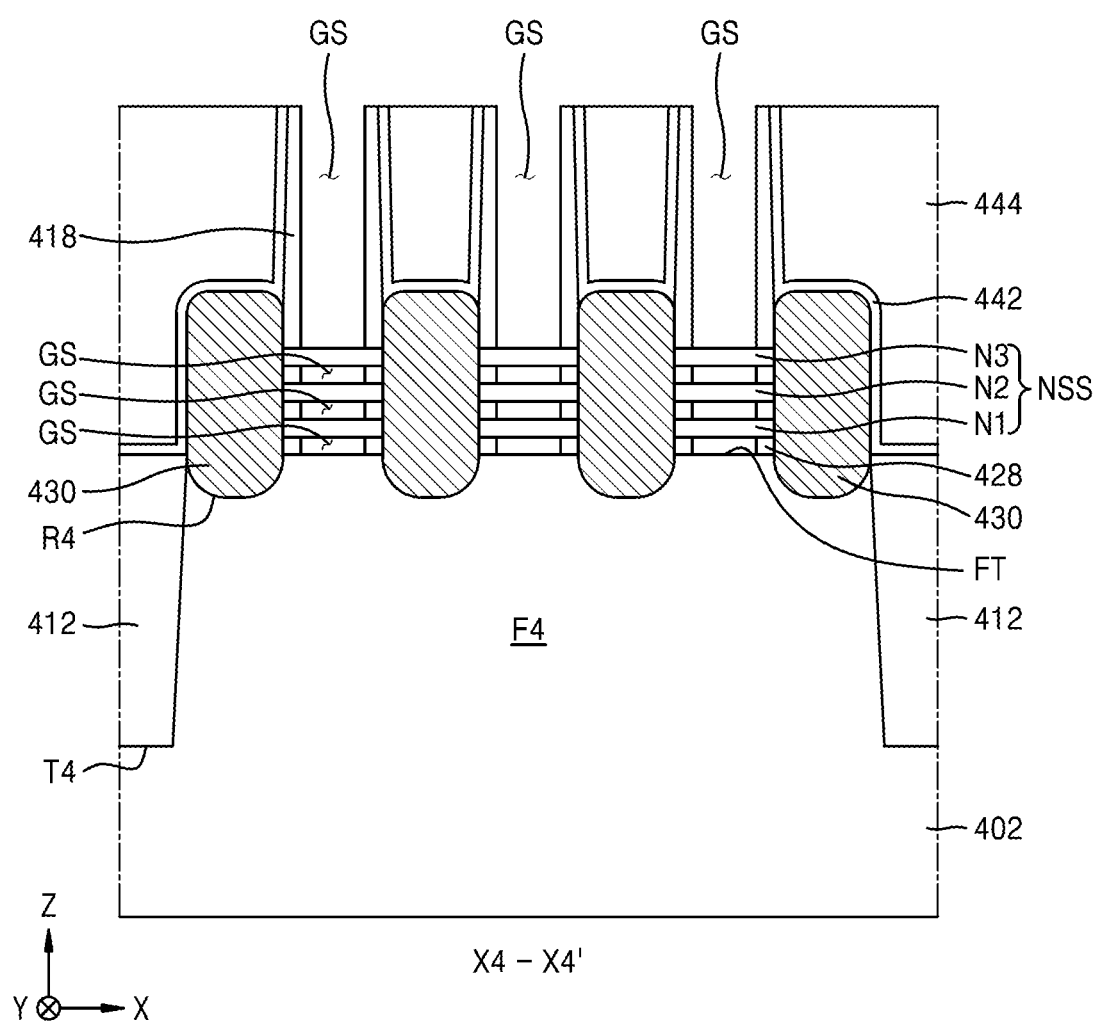
Figure 22B:
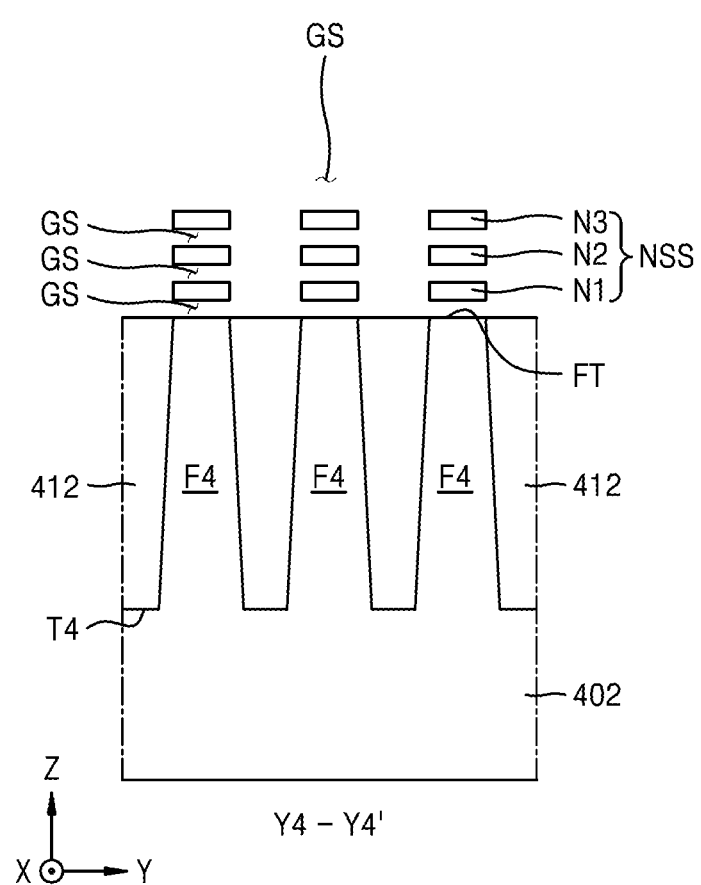

Referring to FIGS. 22A and 22B, in the resultant structure of FIGS. 21A and 21B, a semiconductor material may be epitaxially grown from respective exposed surfaces of the plurality of recess regions R4 and respective exposed surfaces of the first to third nanosheets N1, N2, and N3 to form a plurality of source/drain regions 430. Thereafter, the resultant structure including the plurality of source/drain regions 430 may be at least partially covered by an insulating liner 442, and an inter-gate dielectric film 444 may be formed on the insulating liner 442. Afterwards, a top surface of each of the insulating liner 442 and the inter-gate dielectric film 444 may be planarized to expose a top surface of the capping layer D466.

Thereafter, a plurality of gate spaces GS may be prepared by removing the plurality of dummy gate structures DGS4. The plurality of sacrificial semiconductor layers 404 may be removed through the gate spaces GS, and thus, the gate spaces GS may extend to respective spaces between the first to third nanosheets N1, N2, and N3 and a space between the first nanosheet N1 and the top surface FT.

Figure 23A:
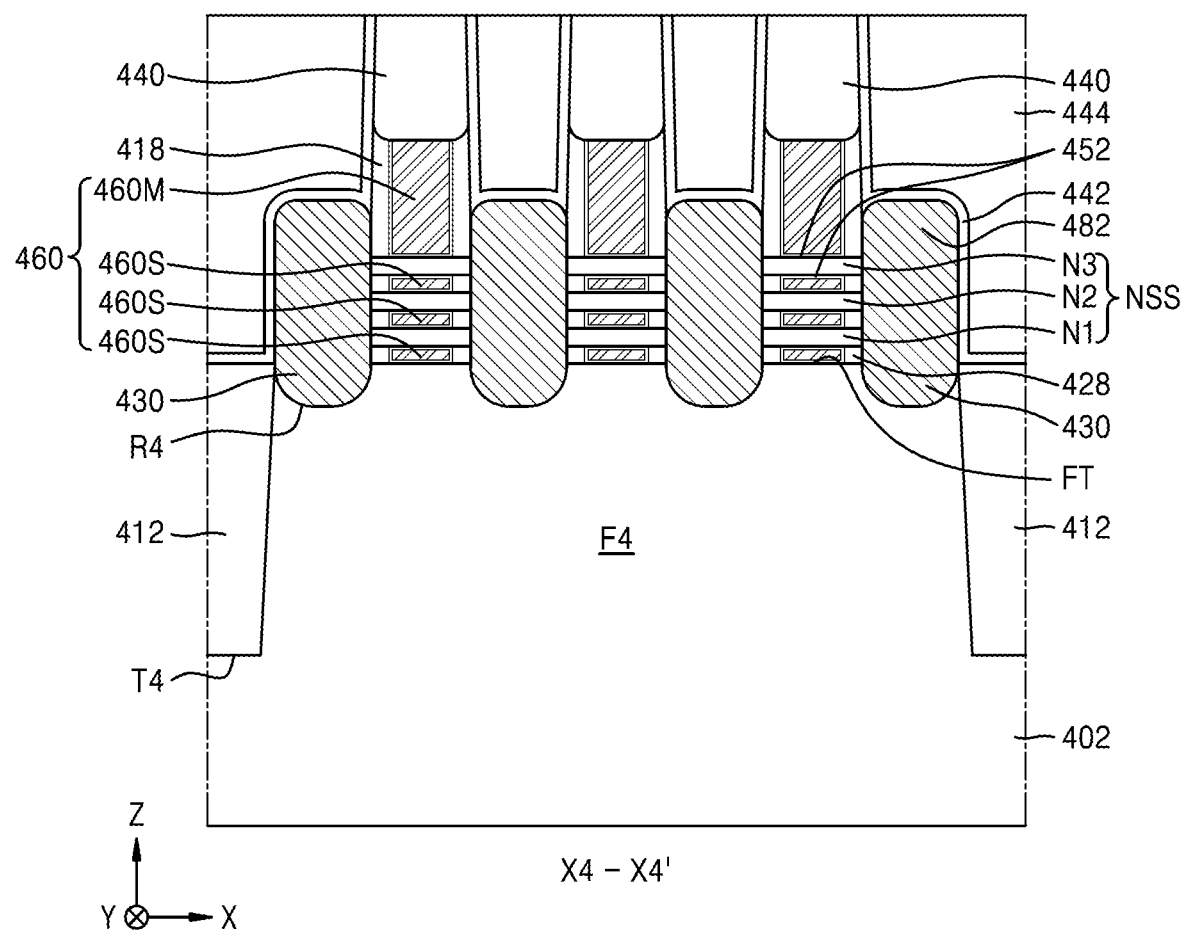
Figure 23B:
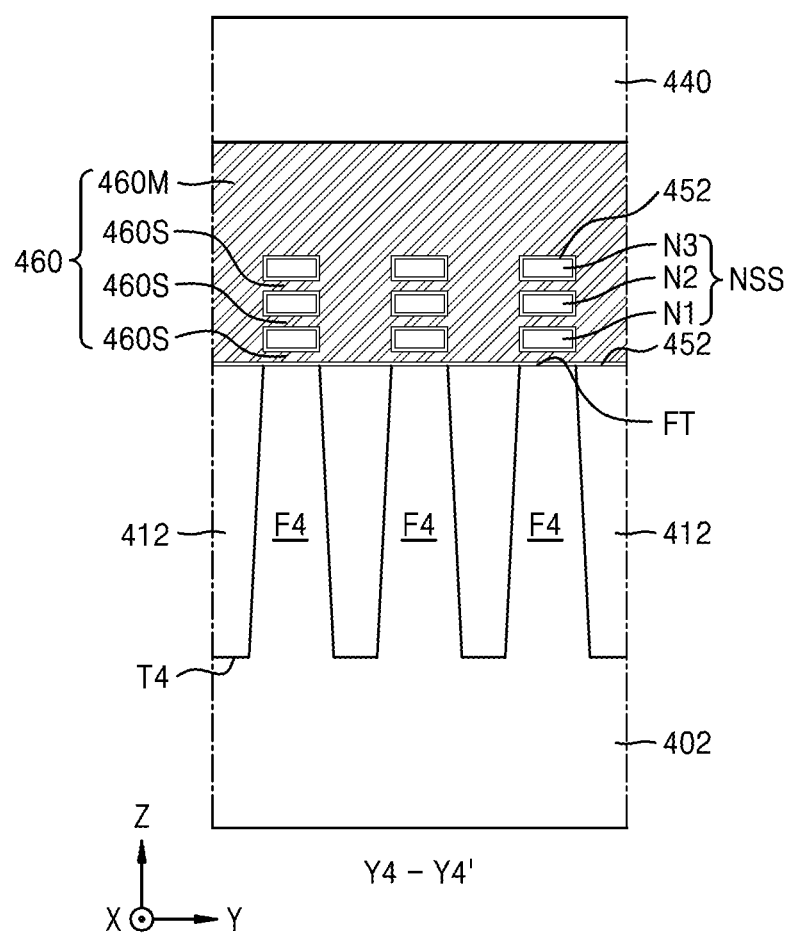

Referring to FIGS. 23A and 23B, a gate insulating film 452 may be formed to at least partially cover the exposed surfaces of the first to third nanosheets N1, N2, and N3 and the fin-type active region F4. A plurality of gate lines 460 may be formed on the gate insulating film 452 to at least partially fill the gate spaces GS. Thereafter, the plurality of gate lines 460 and respective upper portions of the gate insulating film 452 and the plurality of outer insulating spacers 418, which are adjacent to the plurality of gate lines 460, may be removed to empty respective upper spaces of the plurality of gate spaces GS. Thereafter, the upper space of each of the plurality of gate spaces GS may be at least partially filled with the insulating capping line 440. By performing the planarization process the plurality of gate lines 460 and the insulating capping line 440, a height of each of the insulating liner 442 and the inter-gate dielectric film 444 may be reduced.

Figure 24:
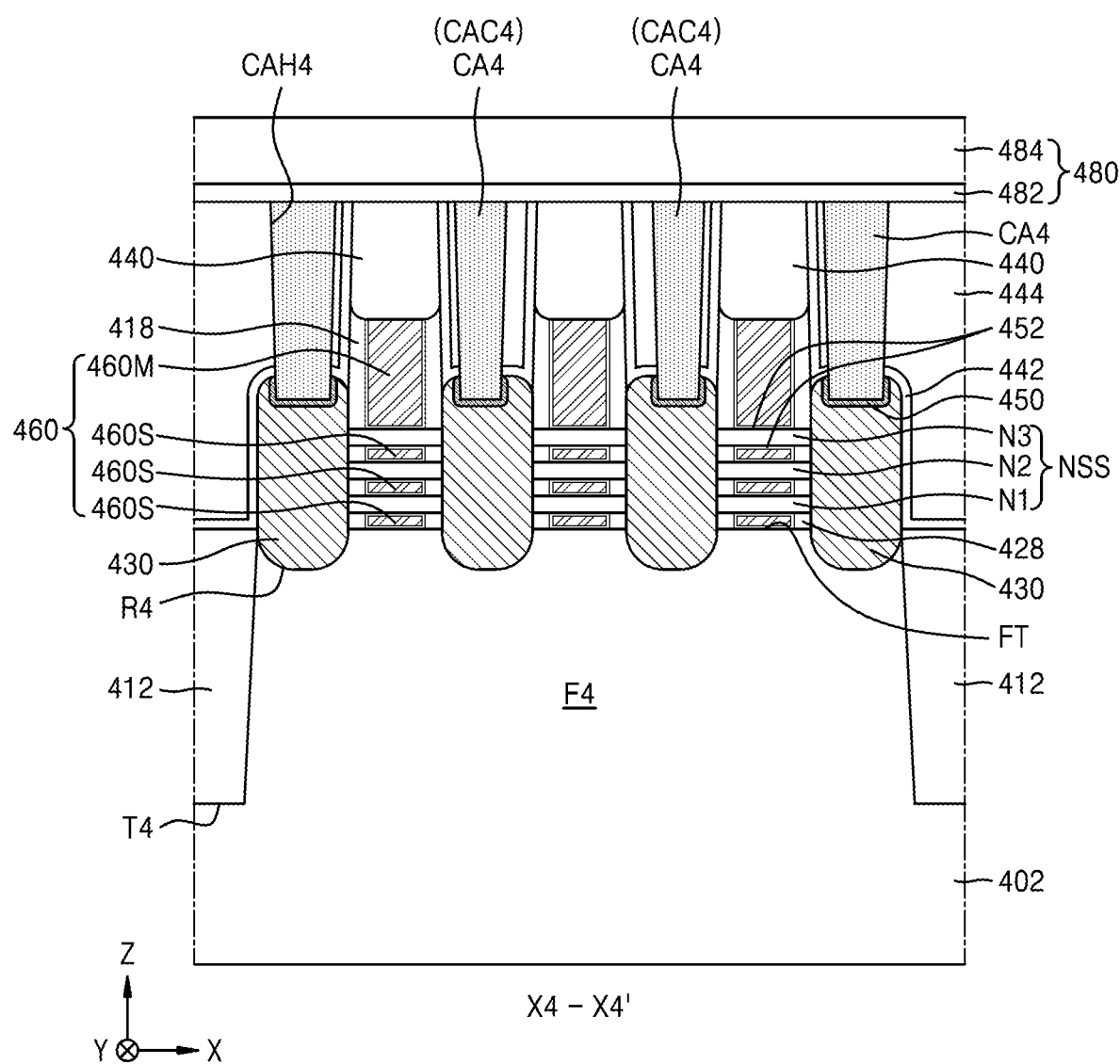

Referring to FIG. 24, the inter-gate dielectric film 444 and the insulating liner 442 may be partially etched to form a plurality of contact holes CAH4 exposing the plurality of source/drain regions 430. Thereafter, a metal silicide film 450 may be formed through the plurality of contact holes CAH4, and a plurality of source/drain contacts CA4 may be formed to at least partially fill the plurality of contact holes CAH4 and at least partially cover the metal silicide film 450. As described above with reference to FIGS. 7, 8A, and 8B, at least some of the plurality of source/drain contacts CA4 may include a first segment CAC4 and a second segment CAN4, which have different widths in the first lateral direction (X direction) and are integrally or monolithically connected to each other.

Thereafter, an insulating structure 480 may be formed by forming an etch stop film 482 and an interlayer insulating film 484 to sequentially at least partially cover the resultant structure including the plurality of source/drain contacts CA4. As shown in FIGS. 7, 8A, and 8B, a plurality of source/drain via contacts CAV4 may be formed to be connected to the plurality of source/drain contacts CA4, and a plurality of gate contacts CB4 may be formed to be connected to the plurality of gate lines 460.

In example embodiments, the plurality of source/drain via contacts CAV4 and a plurality of gate contacts CB4 may be formed simultaneously or in coordination with each other. In other example embodiments, the plurality of source/drain via contacts CAV4 and the plurality of gate contacts CB4 may be sequentially formed using separate processes. In these embodiments, forming the plurality of source/drain via contacts CAV4 may be followed by forming the plurality of gate contacts CB4. In other embodiments, forming the plurality of gate contacts CB4 may be followed by following the plurality of source/drain via contacts CAV4.

In example embodiments, the processes of forming the plurality of source/drain contacts CA4, which are described above with reference to FIG. 24, may be performed using the method described with reference to FIGS. 9 and 10A to 10C.

Although the method of manufacturing the IC device 400 shown in FIGS. 7, 8A, and 8B has been described with reference to FIGS. 18A to 24, it will be understood that IC devices having various other structures may be manufactured by making various modifications and changes in the IC device 400 shown in FIGS. 7, 8A, and 8B within the scope of embodiments of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a fin-type active region extending in a first lateral direction on a device region of a substrate;
   a gate line extending in a second lateral direction on the fin-type active region, wherein the second lateral direction intersects with the first lateral direction;
   a source/drain region adjacent to one side of the gate line on the fin-type active region;
   a gate contact on the gate line and connected to the gate line; and
   a source/drain contact on the source/drain region, the source/drain contact comprising a first segment facing the gate contact and a second segment integrally connected to the first segment, the second segment extending from the first segment in the second lateral direction, wherein a first distance from the first segment to the gate line is greater than a second distance from the second segment to the gate line in the first lateral direction, wherein the source/drain contact comprises a first outer sidewall facing the gate line and the gate contact, and wherein the first outer sidewall comprises a recessed sidewall portion, which is included in the first segment and faces the gate contact, a normal sidewall portion, which is included in the second segment and does not face the gate contact, and a stepped portion between the recessed sidewall portion and the normal sidewall portion.

2. The integrated circuit device of claim 1, wherein a first width of the first segment is less than a second width of the second segment in the first lateral direction.

3. The integrated circuit device of claim 1, wherein a length of the first segment is greater than a length of the gate contact in the second lateral direction.

4. The integrated circuit device of claim 1, wherein the source/drain contact comprises a first outer sidewall facing the gate line and the gate contact and a second outer sidewall opposite to the first outer sidewall, and wherein the first outer sidewall and the second outer sidewall are asymmetrical about a reference line passing the source/drain contact in the second lateral direction.

5. The integrated circuit device of claim 1, wherein the source/drain contact comprises a first outer sidewall facing the gate line and the gate contact and a second outer sidewall opposite to the first outer sidewall, wherein, in the first outer sidewall, a first surface of the first segment is offset from a second surface of the second segment in a direction away from the gate contact in the first lateral direction, and wherein in the second outer sidewall, a third surface of the first segment and a fourth surface of the second segment extend in a straight line in the second lateral direction.

6. The integrated circuit device of claim 1, wherein at least a portion of the first segment of the source/drain contact overlaps the fin-type active region in a vertical direction perpendicular to a plane formed by the first lateral direction and the second lateral direction.

7. The integrated circuit device of claim 1, wherein the substrate further comprises an inter-device isolation region defining the device region, wherein the gate line extends lengthwise in the second lateral direction on the substrate over the device region and the inter-device isolation region, wherein the gate contact is on the inter-device isolation region, and wherein the first segment of the source/drain contact overlaps the inter-device isolation region in a vertical direction perpendicular to a plane formed by the first lateral direction and the second lateral direction.

8. The integrated circuit device of claim 1, wherein a width of the source/drain contact, which extends in the first lateral direction, is variable in the second lateral direction.

9. An integrated circuit device comprising:

a substrate comprising a device region and an inter-device isolation region defining the device region;

a fin-type active region extending in a first lateral direction on the device region;

a gate line on the fin-type active region, the gate line extending lengthwise in a second lateral direction on the substrate over the device region and the inter-device isolation region;

a first source/drain region and a second source/drain region on the fin-type active region, the first source/drain region and the second source/drain region being apart from each other with the gate line therebetween in the first lateral direction;

a gate contact on the gate line, the gate contact being connected to the gate line;

a first source/drain contact on the first source/drain region; and a second source/drain contact on the second source/drain region, wherein the first source/drain contact, the second source/drain contact, or both of the first source/drain contact and the second source/drain contact comprises a first segment facing the gate contact and a second segment integrally connected to the first segment, the second segment extending from the first segment in the second lateral direction, wherein a first distance from the first segment to the gate line is greater than a second distance from the second segment to the gate line in the first lateral direction, wherein each of the first source/drain contact and the second source/drain contact comprises the first segment and the second segment, and a planar shape of the first segment of the first source/drain contact and a planar shape of the first segment of the second source/drain contact are symmetrical about the gate contact.

10. The integrated circuit device of claim 9, wherein each of the first source/drain contact and the second source/drain contact comprises the first segment and the second segment, and wherein a first interval between the first segment of the first source/drain contact and the first segment of the second source/drain contact in the first lateral direction is greater than a second interval between the second segment of the first source/drain contact and the second segment of the second source/drain contact in the first lateral direction.

11. The integrated circuit device of claim 9, wherein a planar shape of the first source/drain contact and a planar shape of the second source/drain contact are asymmetrical about the gate line.

12. The integrated circuit device of claim 9, wherein a first length of the first source/drain contact in the second lateral direction is different from a second length of the second source/drain contact in the second lateral direction.

13. The integrated circuit device of claim 9, wherein each of the first source/drain contact and the second source/drain contact comprise the first segment and the second segment, wherein each of the first source/drain contact and the second source/drain contact comprises a first outer sidewall facing the gate contact and a second outer sidewall opposite to the first outer sidewall, wherein, in the first outer sidewall of each of the first source/drain contact and the second source/drain contact, a first surface of the first segment is offset from a second surface of the second segment in a direction away from the gate contact in the first lateral direction and, wherein in the second outer sidewall of each of the first source/drain contact and the second source/drain contact, a third surface of the first segment and a fourth surface of the second segment extend in a straight line in the second lateral direction.

14. The integrated circuit device of claim 9, wherein a length of the first segment is greater than a length of the gate contact in the second lateral direction.

15. The integrated circuit device of claim 9, wherein the gate contact is on the device region, and
wherein at least a portion of the first segment overlaps the fin-type active region in a vertical direction perpendicular to a plane formed by the first lateral direction and the second lateral direction.

16. The integrated circuit device of claim 9, wherein the gate contact is on the inter-device isolation region, and
wherein at least a portion of the first segment overlaps the inter-device isolation region in a vertical direction.

17. An integrated circuit device comprising:
a substrate comprising a device region and an inter-device isolation region defining the device region;
a fin-type active region extending on the device region in a first lateral direction;
a plurality of gate lines on the fin-type active region, the plurality of gate lines extending lengthwise in a second lateral direction on the substrate over the device region and the inter-device isolation region;
a plurality of source/drain regions on the fin-type active region, the plurality of source/drain regions arranged one by one between the plurality of gate lines;
a plurality of gate contacts on the plurality of gate lines, the plurality of gate contacts being connected to the plurality of gate lines, respectively; and
a plurality of source/drain contacts on the plurality of source/drain regions;
a dummy gate line extending lengthwise in the second lateral direction on the substrate over the device region and the inter-device isolation region; and
a dummy gate contact on the dummy gate line, the dummy gate contact being connected to the dummy gate line,
wherein at least one of the plurality of source/drain contacts comprises a first segment and a second segment integrally connected to the first segment, the first segment facing one gate contact selected from the plurality of gate contacts, the second segment extending from the first segment in the second lateral direction,
wherein a first distance from the first segment to a first gate line to which the selected gate contact is connected, from among the plurality of gate lines, is greater than a second distance from the second segment to the first gate line in the first lateral direction,
wherein the plurality of source/drain contacts comprise a first source/drain contact, which is adjacent to the dummy gate line and has an outer sidewall facing the dummy gate contact, and
wherein the outer sidewall of the first source/drain contact planarly extends without a step in the second lateral direction.

* * * * *